US011314905B2

(12) United States Patent
Childs et al.

(10) Patent No.: US 11,314,905 B2
(45) Date of Patent: Apr. 26, 2022

(54) SYSTEM AND METHOD FOR GENERATING COMPUTERIZED FLOOR PLANS

(71) Applicant: Xactware Solutions, Inc., Lehi, UT (US)

(72) Inventors: Bradley McKay Childs, Lehi, UT (US); Jeffrey C. Taylor, Alpine, UT (US); Jeffery D. Lewis, Orem, UT (US); Corey Reed, Cedar Hills, UT (US)

(73) Assignee: Xactware Solutions, Inc., Lehi, UT (US)

( * ) Notice: Subject to any disclaimer, the term of this patent is extended or adjusted under 35 U.S.C. 154(b) by 426 days.

(21) Appl. No.: 14/620,004

(22) Filed: Feb. 11, 2015

(65) Prior Publication Data

US 2015/0227645 A1 Aug. 13, 2015

Related U.S. Application Data

(60) Provisional application No. 61/938,507, filed on Feb. 11, 2014.

(51) Int. Cl.
*G06F 30/13* (2020.01)

(52) U.S. Cl.
CPC .................................. *G06F 30/13* (2020.01)

(58) Field of Classification Search
CPC .. G06F 17/5004; G06F 17/50; G06F 2217/12; G06F 30/13; G06F 30/00
(Continued)

(56) References Cited

U.S. PATENT DOCUMENTS 6,446,030 B1  9/2002  Hoffman et al.
6,448,964 B1 *  9/2002  Isaacs .................. G06F 3/0362
                                                 345/419

(Continued)

FOREIGN PATENT DOCUMENTS

WO  2014/151122 A1  9/2014
WO  2016/154306 A1  9/2016
WO  2017/100658 A1  6/2017

OTHER PUBLICATIONS

Sankar, Aditya et al., "Capturing Indoor Scenes with Smartphones", Oct. 7-10, 2012, UIST '12, ACM.*

(Continued)

*Primary Examiner* — Cedric Johnson
(74) *Attorney, Agent, or Firm* — McCarter & English, LLP

(57) ABSTRACT

A system and method for generating computerized floor plans is provided. The system comprises a mobile computing device, such as a smart cellular telephone, a tablet computer, etc. having an internal digital gyroscope and camera, and an interior modeling software engine interacts with the gyroscope and camera to allow a user to quickly and conveniently take measurements of interior building features, and to create computerized floor plans of such features from any location within a space, without requiring the user to stay in a single location while taking the measurements. The system presents the user with a graphical user interface that allows a user to quickly and conveniently delineate wall corner features using a reticle displayed within the user interface. As corners are identified, the system processes the corner information and information from the gyroscope to calculate wall features and creates a floor plan of the space with high accuracy.

70 Claims, 16 Drawing Sheets

(58) Field of Classification Search
USPC .......................................................... 703/1
See application file for complete search history.

(56) References Cited

U.S. PATENT DOCUMENTS

| | | | |
|---|---|---|---|
| 8,533,063 B2 | 9/2013 | Erickson | |
| 8,843,304 B1* | 9/2014 | Dupont | G06Q 30/0207 |
| | | | 455/456.1 |
| 8,868,375 B1 | 10/2014 | Christian | |
| 8,983,806 B2 | 3/2015 | Labrie et al. | |
| 9,158,869 B2 | 10/2015 | Labrie et al. | |
| 9,501,700 B2 | 11/2016 | Loveland et al. | |
| 9,679,227 B2 | 6/2017 | Taylor et al. | |
| 10,127,670 B2 | 11/2018 | Lewis et al. | |
| 10,181,079 B2 | 1/2019 | Labrie et al. | |
| 10,387,582 B2 | 8/2019 | Lewis et al. | |
| 10,445,438 B1 | 10/2019 | Motonaga et al. | |
| 2002/0116254 A1 | 8/2002 | Stein et al. | |
| 2003/0009315 A1 | 1/2003 | Thomas et al. | |
| 2007/0080961 A1 | 4/2007 | Inzinga et al. | |
| 2007/0276626 A1 | 11/2007 | Bruffey | |
| 2009/0179895 A1 | 7/2009 | Zhu et al. | |
| 2010/0110074 A1 | 5/2010 | Pershing | |
| 2010/0114537 A1 | 5/2010 | Pershing | |
| 2010/0296693 A1 | 11/2010 | Thornberry et al. | |
| 2011/0056286 A1* | 3/2011 | Jansen | G01C 21/16 |
| | | | 73/149 |
| 2011/0157213 A1 | 6/2011 | Takeyama et al. | |
| 2011/0191738 A1 | 8/2011 | Walker et al. | |
| 2012/0026322 A1 | 2/2012 | Malka et al. | |
| 2012/0179431 A1 | 7/2012 | Labrie et al. | |
| 2012/0253725 A1 | 10/2012 | Malka et al. | |
| 2012/0253751 A1 | 10/2012 | Malka et al. | |
| 2013/0226451 A1* | 8/2013 | O'Neill | G01C 21/206 |
| | | | 701/450 |
| 2013/0262029 A1 | 10/2013 | Pershing | |
| 2013/0314688 A1* | 11/2013 | Likholyot | G01S 17/42 |
| | | | 356/3.1 |
| 2014/0301633 A1 | 10/2014 | Furukawa et al. | |
| 2014/0320661 A1* | 10/2014 | Sankar | H04N 5/23216 |
| | | | 348/158 |
| 2015/0029182 A1 | 1/2015 | Sun et al. | |
| 2015/0073864 A1 | 3/2015 | Labrie et al. | |
| 2015/0093047 A1 | 4/2015 | Battcher et al. | |
| 2015/0116509 A1 | 4/2015 | Birkler et al. | |
| 2015/0153172 A1 | 6/2015 | Starns et al. | |
| 2015/0193971 A1* | 7/2015 | Dryanovski | G06T 17/05 |
| | | | 345/419 |
| 2015/0213558 A1 | 7/2015 | Nelson | |
| 2015/0269438 A1 | 9/2015 | Samarasekera et al. | |
| 2015/0302529 A1 | 10/2015 | Jagannathan | |
| 2016/0098802 A1 | 4/2016 | Bruffey et al. | |
| 2016/0110480 A1 | 4/2016 | Randolph | |
| 2016/0246767 A1 | 8/2016 | Makadia et al. | |
| 2016/0282107 A1* | 9/2016 | Roland | G01B 11/14 |
| 2017/0132711 A1 | 5/2017 | Bruffey et al. | |
| 2017/0132835 A1 | 5/2017 | Halliday et al. | |
| 2017/0169459 A1 | 6/2017 | Bruffey et al. | |
| 2017/0206648 A1 | 7/2017 | Marra et al. | |
| 2017/0221152 A1 | 8/2017 | Nelson et al. | |
| 2017/0316115 A1* | 11/2017 | Lewis | G06T 7/55 |
| 2017/0330207 A1 | 11/2017 | Labrie et al. | |
| 2017/0345069 A1 | 11/2017 | Labrie et al. | |
| 2018/0053329 A1 | 2/2018 | Roberts et al. | |
| 2018/0067593 A1 | 3/2018 | Tiwari et al. | |
| 2018/0286098 A1 | 10/2018 | Lorenzo | |
| 2018/0330528 A1 | 11/2018 | Loveland et al. | |
| 2018/0357819 A1 | 12/2018 | Oprea | |
| 2018/0373931 A1 | 12/2018 | Li | |
| 2019/0114717 A1 | 4/2019 | Labrie et al. | |
| 2019/0147247 A1 | 5/2019 | Harris et al. | |
| 2019/0340692 A1 | 11/2019 | Labrie et al. | |
| 2019/0377837 A1 | 12/2019 | Lewis et al. | |
| 2020/0100066 A1 | 3/2020 | Lewis et al. | |
| 2021/0076162 A1 | 3/2021 | Wang et al. | |
| 2021/0103687 A1 | 4/2021 | Harris et al. | |

OTHER PUBLICATIONS

Fung et al. "A Mobile Assisted Localization Scheme for Augmented Reality", Fall 2012, Department of Computer Science and Engineering, The Chinese University of Hong Kong.*

Fung, Huen Shiu et al., "A Mobile Assisted Localization Scheme for Augmented Reality", Fall 2012, Department of Computer Science and Engineering, The Chinese University of Hong Kong. (Year: 2012).*

Farin, Dirk et al. ("Floor-Plan Reconstruction from Panoramic Images"), Sep. 23-28, 2007, MM '07, ACM. (Year: 2007).*

Zhang, Ying et al. "Walk & Stretch: Create Floor Plans with an RGB-D Camera", Sep. 5-8, 2012, UbiComp '12, ACM. (Year: 2012).*

International Search Report of the International Searching Authority dated May 14, 2015, issued in connection with International Application No. PCT/US15/015491 (3 pages).

Written Opinion of the International Searching Authority dated May 14, 2015, issued in connection with International Application No. PCT/US15/015491 (9 pages).

Fung, et al., "A Mobile Assisted Localization Scheme for Augmented Reality," Department of Computer Science and Engineering, The Chinese University of Hong Kong, 2012 (76 pages).

Sankar, et al., "Capturing Indoor Scenes With Smartphones," UIST'12, Oct. 7-10, 2012, Cambridge, Massachusetts (9 pages).

International Search Report of the International Searching Authority dated Mar. 27, 2017, issued in connection with International Application No. PCT/US2016/65947 (3 pages).

Written Opinion of the International Searching Authority dated Mar. 27, 2017, issued in connection with International Application No. PCT/US2016/65947 (7 pages).

Office Action dated Sep. 26, 2018, issued in connection with U.S. Appl. No. 15/374,695 (33 pages).

Notice of Allowance dated May 13, 2019, issued in connection with U.S. Appl. No. 15/374,695 (7 pages).

Extended European Search Report dated Jun. 11, 2019, issued in connection with European Patent Application No. 16873975.3 (8 pages).

Communication Pursuant to Article 94(3) EPC issued by the European Patent Office dated Apr. 22, 2020, issued in connection with European Patent Application No. 16873975.3 (6 pages).

International Search Report of the International Searching Authority dated Dec. 12, 2019, issued in connection with International Application No. PCT/US2019/52670 (3 pages).

Written Opinion of the International Searching Authority dated Dec. 12, 2019, issued in connection with International Application No. PCT/US2019/52670 (5 pages).

Office Action dated Feb. 5, 2020, issued in connection with U.S. Appl. No. 16/580,741 (15 pages).

Office Action dated Sep. 22, 2020, issued in connection with U.S. Appl. No. 16/580,741 (14 pages).

Examination Report No. 1 dated Mar. 30, 2021, issued by the Australian Patent Office in connection with Australian Patent Application No. 2016366537 (6 pages).

Office Action dated Apr. 21, 2021, issued in connection with U.S. Appl. No. 16/580,741 (15 pages).

Communication Pursuant to Article 94(3) EPC issued by the European Patent Office dated Feb. 18, 2021, issued in connection with European Patent Application No. 16873975.3 (5 pages).

International Search Report of the International Searching Authority dated Feb. 11, 2019, issued in connection with International Application No. PCT/US18/60762 (3 pages).

Written Opinion of the International Searching Authority dated Feb. 11, 2019, issued in connection with International Application No. PCT/US18/60762 (7 pages).

Office Action dated Apr. 16, 2020, issued in connection with U.S. Appl. No. 16/189,512 (10 pages).

(56) References Cited

OTHER PUBLICATIONS

U.S. Appl. No. 62/512,989, filed May 31, 2017 entiitled, "Systems and Methods for Rapidly Developing Annotated Computer Models of Structures" (47 pages).
Office Action dated Dec. 14, 2020, issued in connection with U.S. Appl. No. 16/189,512 (10 pages).
Extended European Search Report dated Jul. 1, 2021, issued by the European Patent Office in connection with European Application No. 18876121.7 (8 pages).
Office Action dated Jul. 20, 2021, issued in connection with U.S. Appl. No. 16/189,512 (11 pages).
Office Action dated Dec. 27, 2021, issued in connection with U.S. Appl. No. 16/580,741 (13 pages).
Invitation to Pay Additional Fees issued by the International Searching Authority dated Feb. 2, 2022, issued in connection with International Application No. PCT/US21/63469 (2 pages).
Extended European Search Report dated Feb. 18, 2022, issued in connection with European Patent Application No. 19866788.3 (9 pages).

\* cited by examiner

SYSTEM AND METHOD FOR GENERATING COMPUTERIZED FLOOR PLANS

RELATED APPLICATIONS

This application claims the benefit of U.S. Provisional Application Ser. No. 61/938,507 filed on Feb. 11, 2014, the entire disclosure of which is expressly incorporated herein by reference.

BACKGROUND OF INVENTION

Field of the Disclosure

The present disclosure relates generally to a system and method for generating computerized floor plans using a mobile computing device. More specifically, the present disclosure relates to a system and method for measuring interior features of a space (such as wall lengths, corners, etc.), processing the measured parameters to create a computerized (digital) floor plan of the space, and outputting the computerized floor plan.

Related Art

Floor plans are useful in a vast number of fields, such as construction and/or insurance estimation, interior decorating, real estate valuation, and other applications. Floor plans are not always available, and when they are, they sometimes lack accuracy. Moreover, manually measuring room-features is time-consuming and prone to inaccurate results. Some attempts have been made to create floor plans with the help of computers. However, such systems may not always be reliable, and they can be difficult for a user to utilize. Further, some systems require a user to remain in one place while measuring all the dimensions of an entire room, which is inconvenient and can lead to incorrect results. Therefore, there is a need for a system for generating computerized floor plans that is easy to use and provides accurate results.

SUMMARY OF THE INVENTION

The present invention relates to a system and method for generating computerized floor plans. The system comprises a mobile computing device, such as a smart cellular telephone, a tablet computer, etc. having an internal digital gyroscope and camera, and an interior modeling software engine which is stored on and executed by the mobile computing device, and which interacts with the gyroscope and camera to allow a user to quickly and conveniently take measurements of interior building features (such as dimensions, locations of corners, etc.), and to create computerized (digital) floor plans of such features from any location within a space, without requiring the user to stay in a single location while taking the measurements. The system presents the user with a graphical user interface that allows a user to quickly and conveniently delineate wall corner features using a reticle displayed within the user interface. Using the reticle, the user can identify and mark each corner of the interior of a room in sequence, and need not stay in one location while identifying such feature. As corners are identified, the system processes the corner information and information from the gyroscope to calculate wall features (e.g., dimensions such as length) and creates a floor plan of the space with high accuracy. The floor plan is displayed to the user and can also be transmitted to a remote computer systems such as a building estimation server for further use.

BRIEF DESCRIPTION OF THE DRAWINGS

The foregoing features of the invention will be apparent from the following Detailed Description, taken in connection with the accompanying drawings, in which.

DETAILED DESCRIPTION

The present disclosure relates to a system and method for generating computerized floor plans, as discussed in detail below in connection with FIGS. 1-20.

Figure 1:
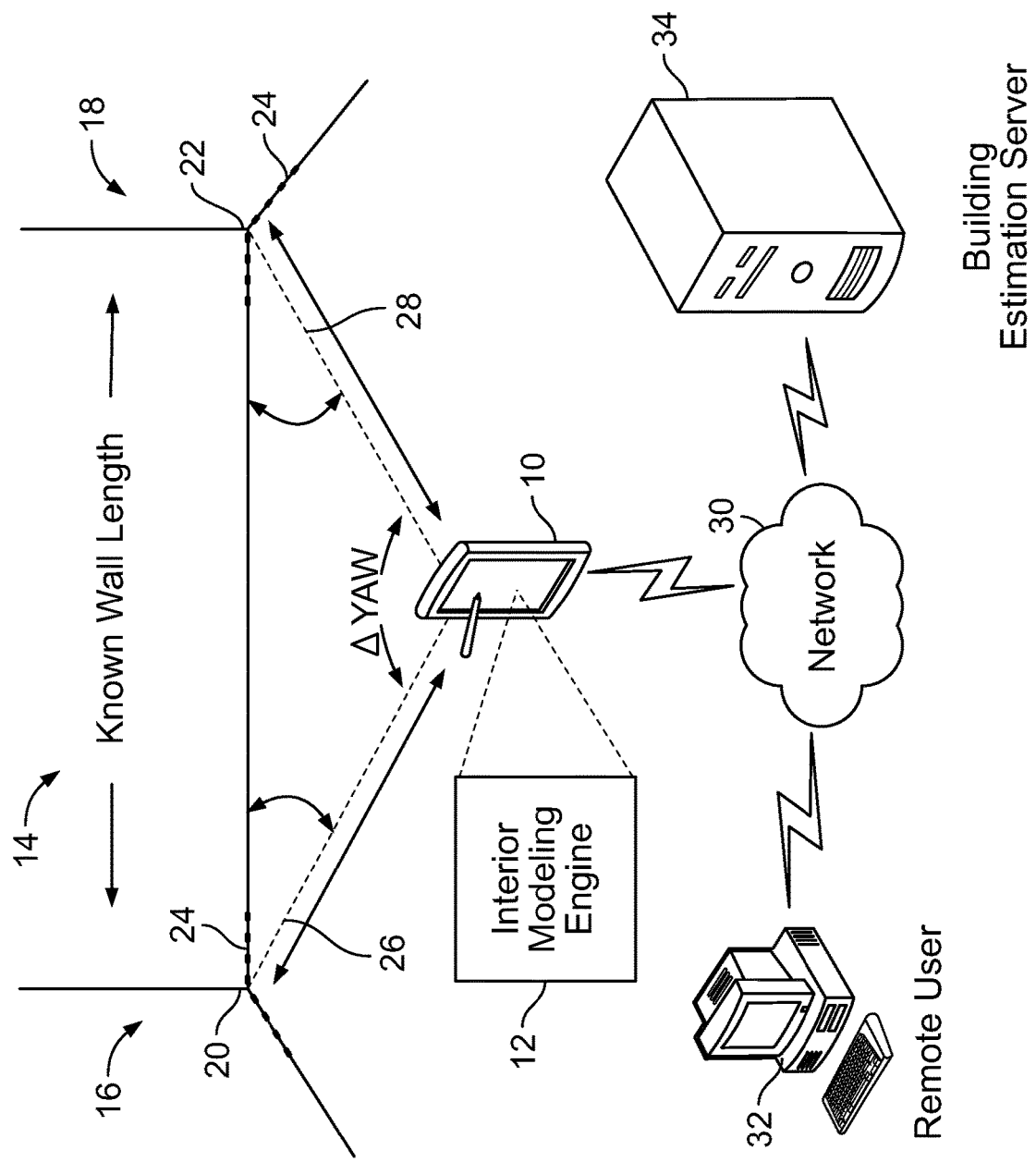
FIG. 1 is a diagram showing a general overview of the floor plan generating system.

FIG. 1 is a diagram showing a general overview of the floor plan generating system. The system comprises a mobile computing device 10 that includes an interior modeling engine 12, a display screen, and a local memory. While the interior modeling engine 12 is described herein as a single engine, it should be understood that the interior modeling engine 12 could be made up of any number of engines while remaining within the scope of the present disclosure. The mobile computing device 10 could be in a communicative relationship with a remote user computing device 32 and/or with a building estimation server 34 via a network 30. The mobile computing device 10 could be utilized within an interior space of a building, such as a room. It should be well understood that the term "indoor space" is used to mean any kind of space, including indoors or outdoors. For example, the "indoor space" could be a home, room, office, store, building lobby, outdoor deck, construction site, etc. Also, the term "wall" is used to mean any kind of wall-like structure defining an area, and the wall need not be a load-bearing. For example, a "wall" could be a building partition wall, a fence, etc.

An interior modeling engine 12 could be in the form of a software application stored in the local memory of the mobile computing device 10 and executable by the mobile computing device 10. The system includes a functionality for measuring rotational movement of the mobile device 10 relative to the interior space. For example, the mobile device could include a gyroscope (e.g., a microelectromechanical ("MEMS") gyroscope). The measurements generated by the gyroscope could be outputted to the interior modeling engine 12, which could process the gyroscopic measurements to calculate lengths and angles of walls within the interior space. Using the wall lengths and angles, the interior modeling engine 12 could create a floor plan representing the interior space.

As shown in FIG. 1, to measure the wall lengths and angles, a user could stand in the interior space and position the mobile device 10 to face a first wall with a known length. The first wall 14 has a left side that forms a left corner 20 with a second wall 16 and the floor, and a right side that forms a right corner 22 with a third wall 18 and the floor. The user could use the mobile device 10 to measure parameters at the right corner 22 and at the left corner 20. The interior modeling engine 12 could use the known wall length and the measured parameters to calculate a first distance 26 from the user to the left corner 20 (e.g., first corner), and a second distance 28 from the user to the right corner 22 (e.g., second corner). The user could then use the mobile device 10 to measure additional parameters for additional walls (16, 18, etc.) within the interior space. The interior modeling engine 12 could use the first distance 26, second distance 28, and additional parameters to calculate lengths of the additional walls and angles between them. The interior modeling engine 12 could process the calculated lengths and angles (e.g., apply calibration and correction algorithms) to generate a floor plan for the interior space. The interior modeling engine 12 could output the generated floor plan, for example, by presenting it to the user via the display screen. Additionally, the generated floor plans could be sent to a remote user 32 and/or to the building estimation server 34. The generated floor plans could be compatible with and/or integrated into (e.g., as a sub-application) other applications.

The system could use microelectromechancial gyroscopic sensors of the mobile computing device 10 to acquire pitch and yaw measurements based on the device orientation at the moment a corner of a room is captured. When the interior modeling engine 12 is initiated, the yaw angle is set to zero degrees and a yaw reference is established. From then onward, the readings are all relative to the 0 degree reference. The system then processes the yaw information to determine the sizes of the walls and the angles between the walls. The system processes the information based on algorithms that use the Pythagorean Theorem, such that after establishing the height of the device (through a calibration step discussed below), and establishing the angle of the device when it is pointing to a corner on the ground (via the gyroscope), the system determines the distance from the corner to the position of the device. The process can include five phases: Calibration, Wall Capturing, Wall Processing, Room Squaring and Data Correction, each of which be discussed in greater detail below.

Figure 2:
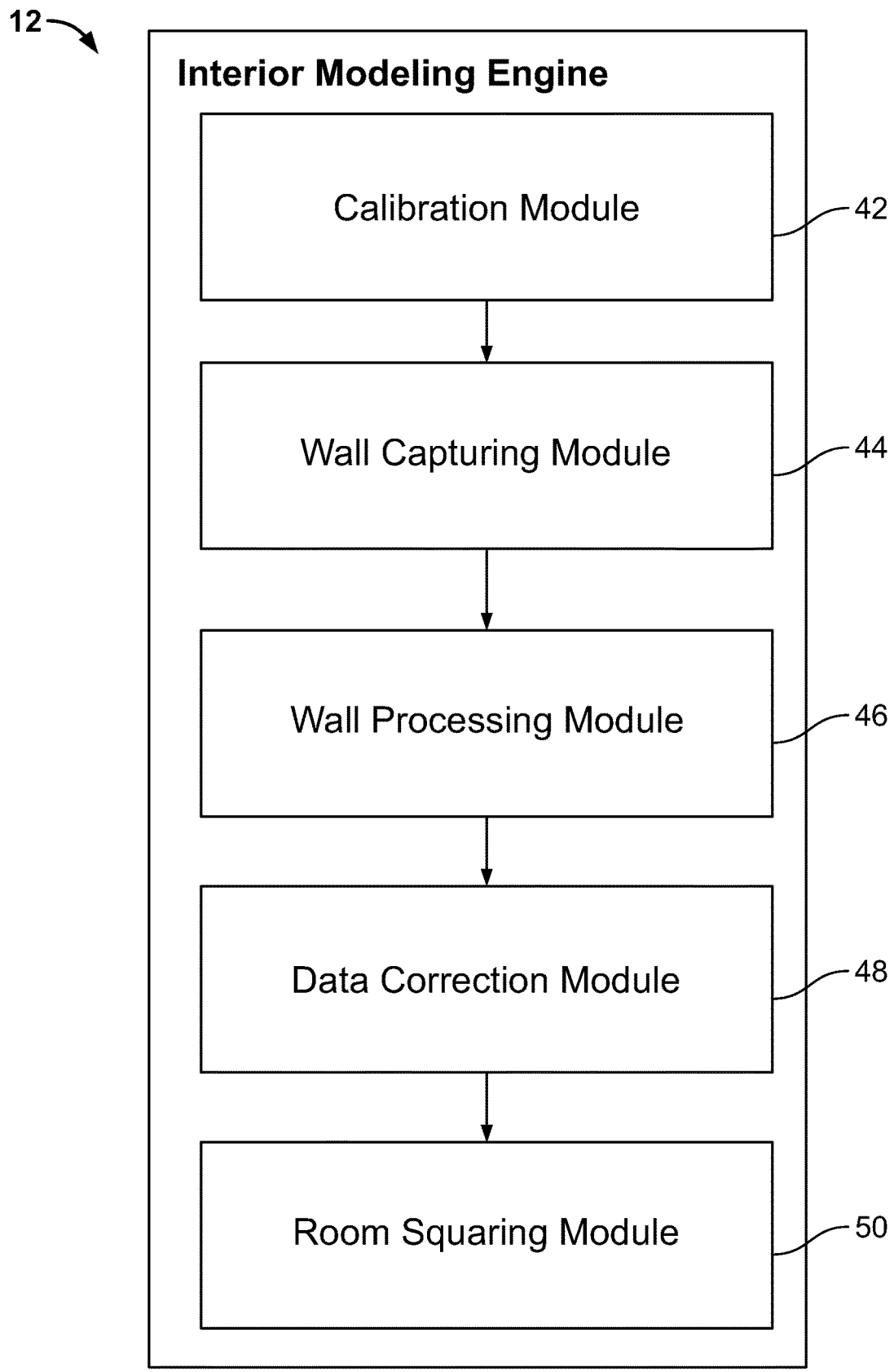
FIG. 2 is a diagram showing software components of the interior modeling engine of the system, executed by the mobile computing device.

FIG. 2 is a diagram showing software components 42-50 of the interior modeling engine 12 of the system. The interior modeling engine 12 comprises a calibration module 42 for calibrating the mobile computing device 10, a wall capturing module 44, which uses the calibration data to process received measurement data to determine wall information, a wall processing module 46, which processes wall information, a data correction module 48, and a room squaring module 50 for detecting and resolving inaccuracies. Thus, the functional modules 42-50 of the interior modeling engine 12 can generate an accurately dimensioned floor plan of the interior space.

Figure 3:
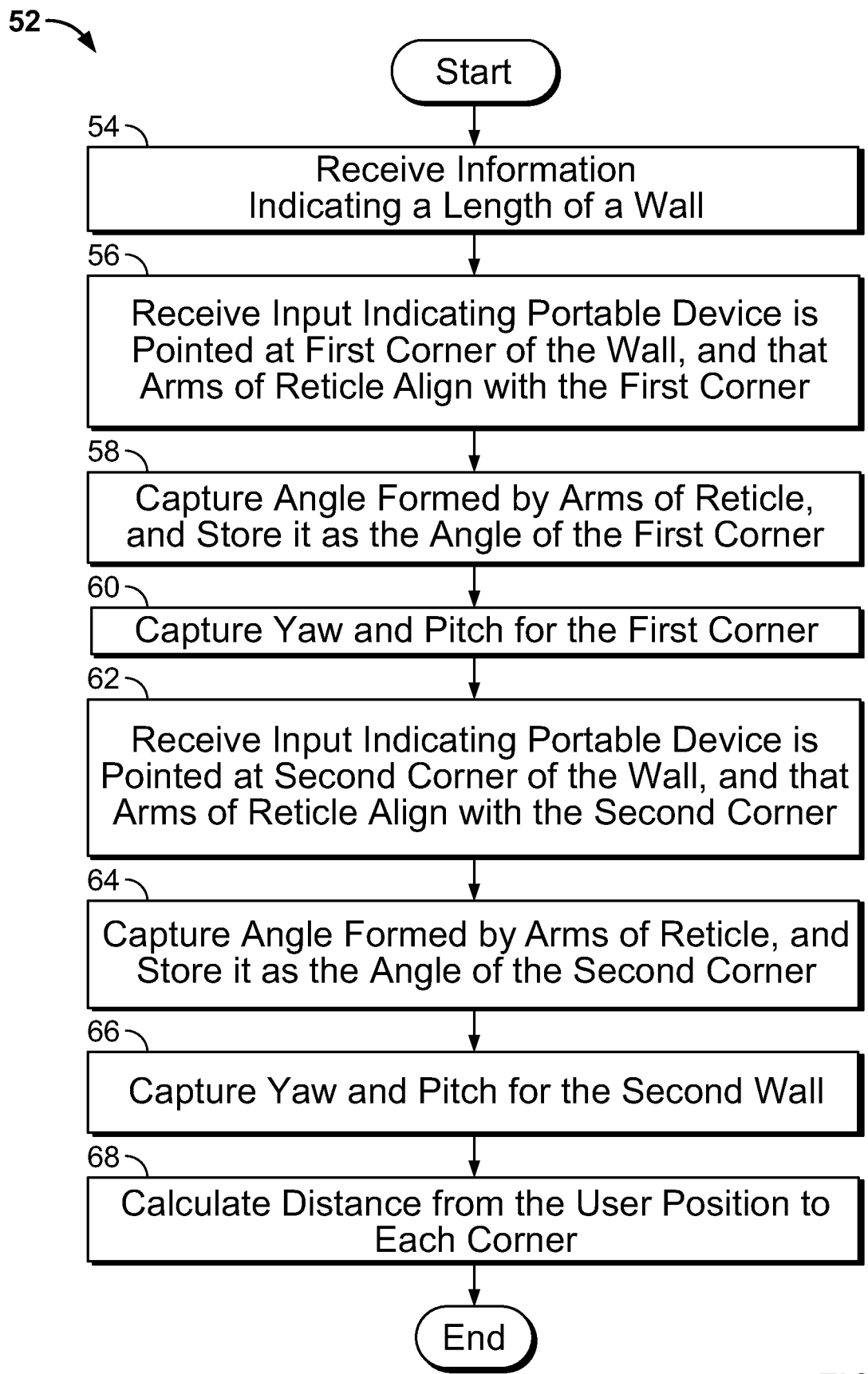
FIG. 3 is a flowchart showing processing steps carried out by the calibration module of the interior modeling engine.

FIG. 3 is a flowchart showing processing steps carried out by the calibration module 42 of the interior modeling engine 12. During the calibration step, the interior modeling engine 12 calculates the height at which a user holds the device 10 while capturing a first wall of known length. The calibration is based on the principle that, if the length of one side a triangle is known and the three angles of a triangle are known, then the lengths of the other two sides can be calculated. Using a reticle, the calibration module 42 can determine the angles at the two corners of the wall. In addition, the module 42 can determine the angle from one corner to the other by the difference between the yaw angle (angle of rotation about the yaw axis of the mobile computing device) from one corner to the other. In step 54, the calibration module 42 receives information indicating a length of a wall (e.g., a "first wall"). A user could input data (via the mobile computing device, a remote computing system, etc.) identifying the wall length for any wall. The interior modeling software could then invoke the mobile computing device's 10 camera functionality, such that when the mobile computing device's 10 cameral lens faces the first wall, an image of the first wall appears on the mobile device's display screen.

The interior modeling engine 12 could cause graphical content to be displayed on the display screen simultaneously with the image of the first wall. For example, a reticle, a graphic, and a "capture" button could appear on the mobile device's display screen simultaneously with the first wall, to assist the user in capturing measurements of the interior space. As will be described in further detail with reference to FIGS. 4 and 6A-B, the reticle can comprise two arms forming an angle. The user can move the mobile device so that the first corner appears in the display screen. The user can reconfigure the arms of the reticle to match arms forming the first corner. When the arms of the reticle are aligned with the arms of the first corner (when the angle of the reticle matches the angle of the first corner), the user can invoke the capture button which, in step 56, causes the calibration module 42 to receive information indicating that the mobile computing device 10 is pointed at a first corner and that the arms of the reticle align with the first corner of the first wall. Then, in step 58, the device captures the angle of the reticle, and stores the angle of the reticle as the angle of the first corner. Also, in step 60, the gyroscope of the device takes and stores first measurements of the mobile device 10 along the yaw and pitch axes. The user can then move the mobile device 10 so that the reticle is aligned with the second corner, and reconfigure the reticle so that the arms of the reticle match arms forming the second corner. When the arms of the reticle are aligned with the arms of the second corner (when the angle reticle matches the angle of the second corner), the user can activate the "capture" button again. Then, in step 62, the calibration module receives input indicating that the mobile computing device 10 is pointed at a second corner of the wall and that the angle of the reticle matches the angle of the second corner. In step 64, the module 42 captures the angle of the reticle, and stores the angle of the reticle as the angle of the second corner. Also, in step 66, the gyroscope takes and stores second measurements of the mobile device 10 along the yaw and pitch axes. In step 68, using the information obtained in steps 52-56, the device calculates the distance from the user position to each corner.

Figure 4:
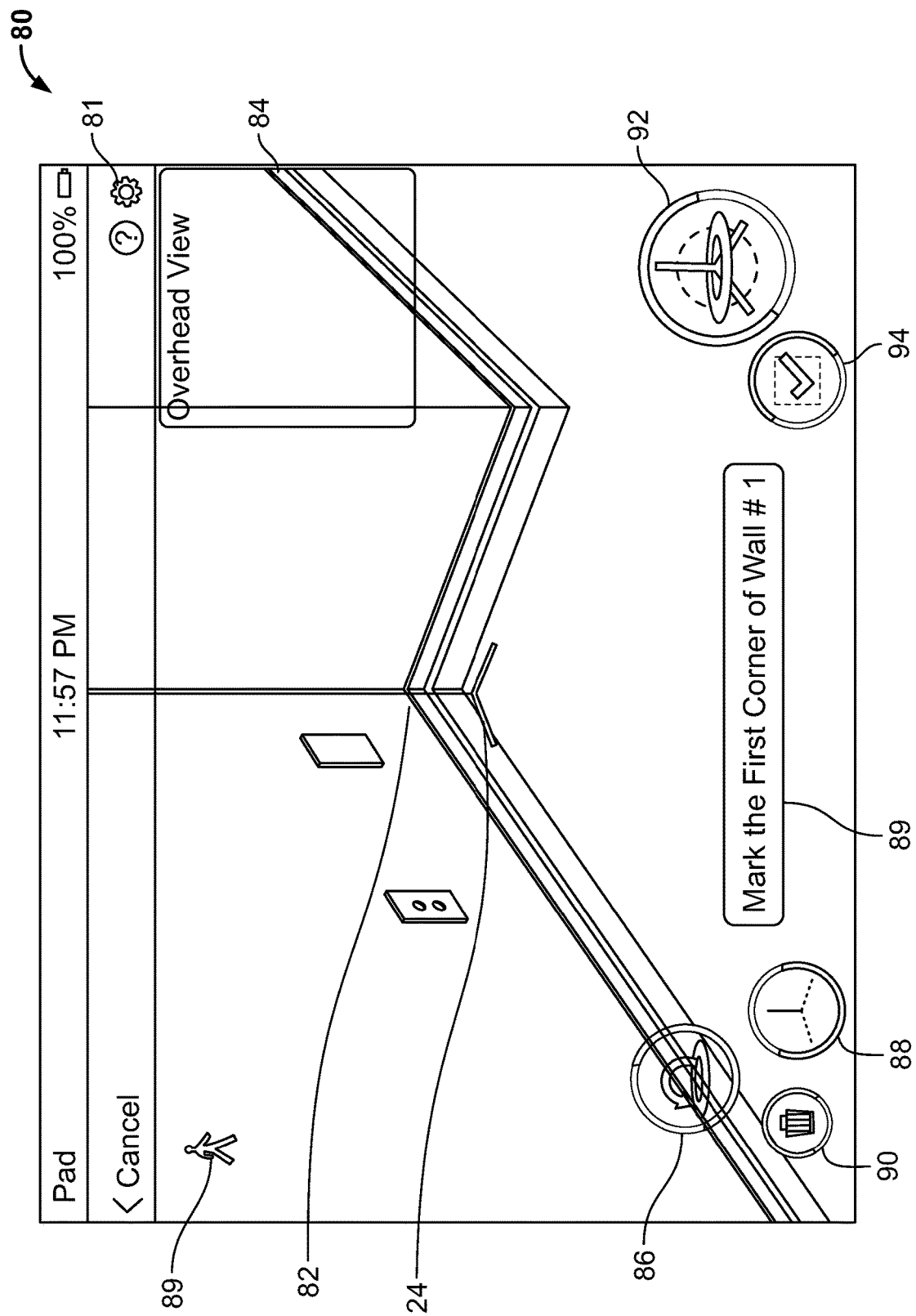
FIG. 4 is a screenshot showing a screen user interface generated by the system, which allows a user to perform calibration of the system.

FIG. 4 is a screenshot showing a screen user interface generated by the system, which allows a user to perform calibration of the system. As shown, the interior modeling engine 12 can cause graphics to appear on the screen 80 simultaneously with an image of the interior space sent from the camera of the mobile device 10. For example, the screen 80 could include a reticle 24, a vertical graphic 82, an extend line button 88 for providing the user control over the arms of the reticle 24, an undo button 86 for allowing a user to undo a measurement (e.g., of a corner or of a wall), and a trash icon 90 for allowing a user to discard measurements (e.g, of an entire room). The screen 80 could also include a calibration button 81 for allowing a user to prompt the calibration module 42 to calibrate the mobile computing device 10. The user can move the mobile computing device 10 until the first corner 20 appears on the display screen 80, and the vertical guide 82 is aligned with a line formed by the first wall and the second wall. When the vertical guide 82 is so aligned, the reticle 24 will be near the first corner 20, but the arms of the reticle 24 will not necessarily be aligned with arms of the first corner. As will be discussed further with reference to FIG. 6B, a user can reconfigure the arms of the reticle 24 to match the arms of the first corner. Once the vertical guide 82 is aligned with the line formed by the first wall and the second wall, and the arms of the reticle 24 match the arms of the first corner, the user invokes the "mark corner" button 92. Then, the angle formed by the arms of the reticle 24 is stored as the angle of the first corner. Also, the interior modeling engine 12 records the pitch and yaw angles of the mobile computing device 10 via the gyroscope.

The screen 80 can also include an "overhead view" area 84 for providing a sketch of the walls that have been captured to show the user the floorplan as it is being created. An "Instruction Text" message box 89 can keep track of which corner and which wall the user is currently capturing, and provide instructions. For example, in FIG. 4, after the user has initiated the application but before the user has captured any corners, the instruction text message box could read "Mark the first corner of wall #1."

Figure 5:
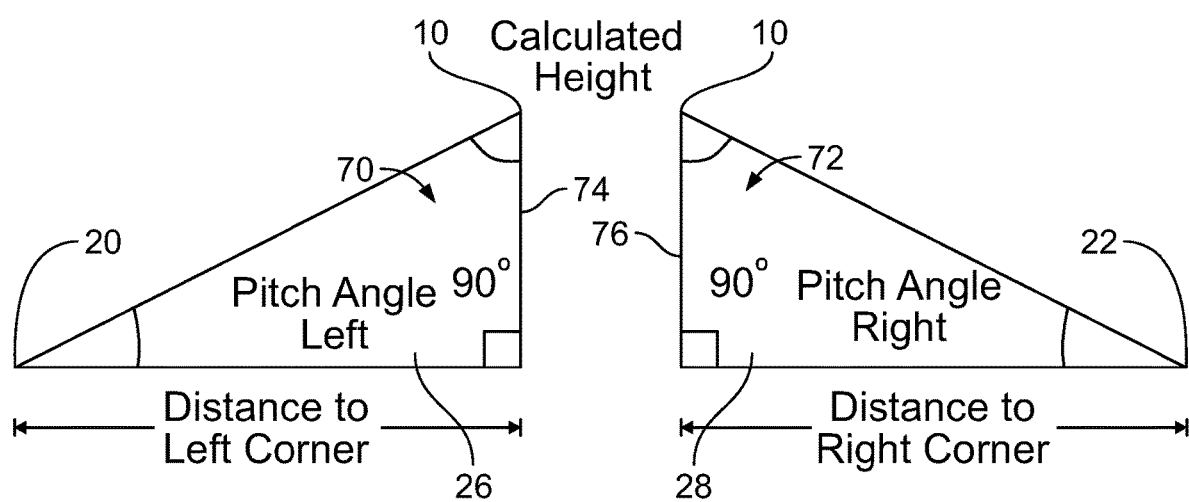
FIG. 5 is a diagram showing measurements taken by the calibration module to calculate the height of the mobile computing device.

Now turning to FIG. 5, with the pitch 70 to the first corner 20 and the distance 26 to the first corner 20 known, the calibration module 42 can calculate the height 74 of the device 10. The calibration module 42 can also use the pitch 72 to the second corner 22 and distance 28 to the second corner 22 to calculate a height 76 of the device again. The calibration module 42 can then average the two calculated heights 74, 76 to produce a more accurate height reading. The calibration module 12 can then cause the calculated height to be stored so that it can be later used as the default height by the interior modeling engine 12 in subsequent calculations.

The second major component of the interior modeling engine 12 is the wall capturing module 44. In carrying out the wall capturing step, a user captures all of the walls of a room sequentially (clockwise or counter-clockwise), one wall at a time. A wall is captured by a user simply capturing the first corner of a wall followed by capturing the second corner of the same wall. The user is permitted to move around the room when moving from one wall to the next, so long as the user can see both corners of the wall to be captured from the same position. In fact, when a user positions him/herself to directly face the wall, accuracy of the measurements can improve. Once the user has captured the first corner of a wall, the user should not move before capturing the second corner of the wall.

Figure 6A:
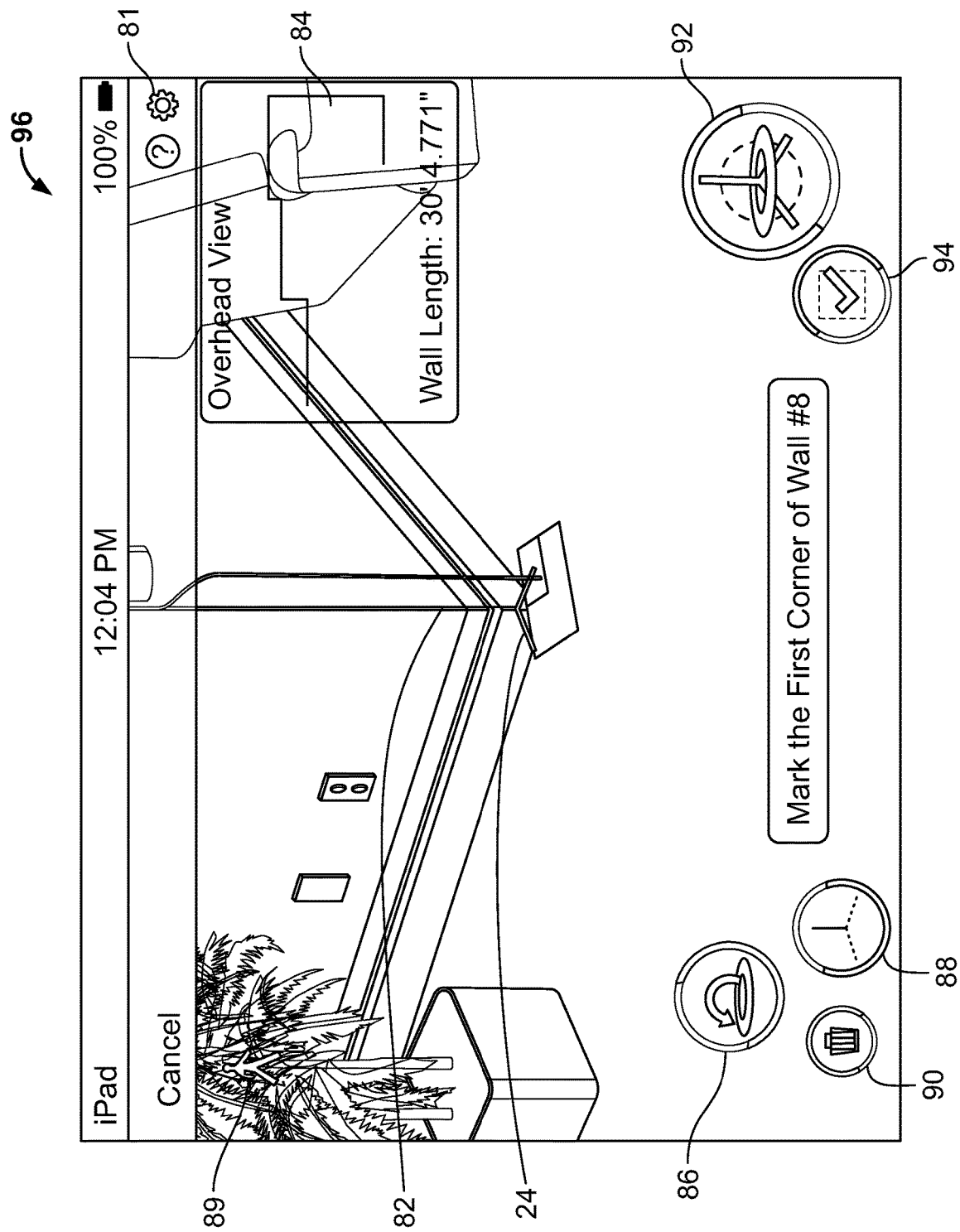
FIGS. 6A-6B are screenshots showing how a user can capture the corners of each wall in the structure using a reticle in the user interface of the system and associated user interface elements.
Figure 6B:
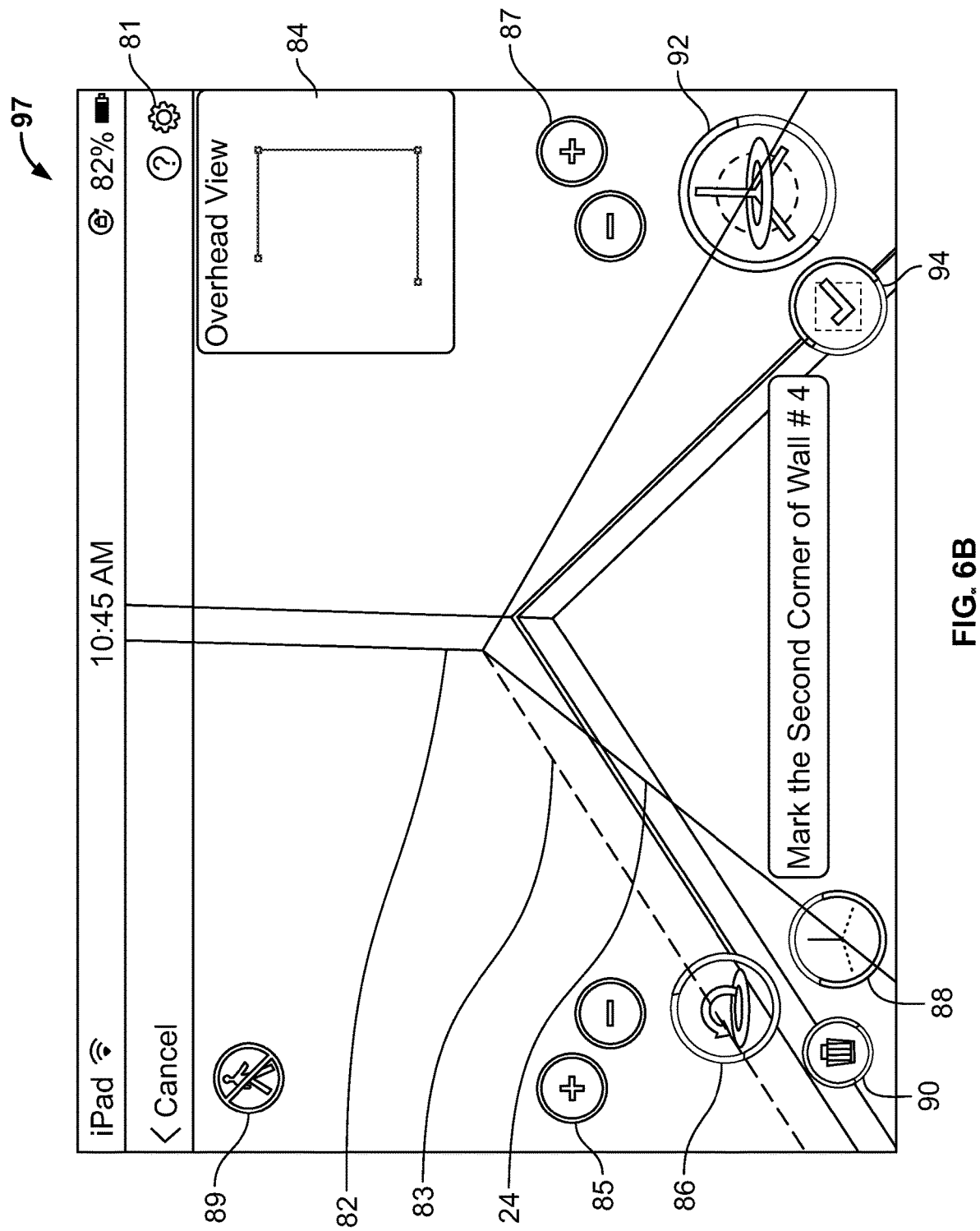

As shown in FIGS. 6A and 6B, a user can capture the corners of subsequent walls similarly to how the user captured the corners of the first wall. For each wall, the user stands facing the wall. For example, for the second wall, the user views the display screen and moves the mobile computing device until the reticle 24 and guide 82 on the mobile computing device 10 align with the first corner of the second wall (which is the same corner as the second corner of the first wall). Once the reticle 24 and guide 82 are aligned, the user clicks on the "wall capture" button 92. The user then captures the remaining walls in the room. Once all of the walls have been captured, the user clicks on the "complete room" button 94, which sends a message to the interior modeling engine 12 indicating that all of the walls in the room have been captured. As such, the interior modeling engine 12 gathers the data acquired during the wall capturing steps and processes the data to generate a floor plan, which is described in detail below.

The screen 80 can include a walk icon 89 for informing the user whether it is safe to walk. For example, a user can move about the interior space between capturing walls (e.g., before the user has captured the first corner of an eighth wall), and thus the walk icon 89 in 6A indicates that it is safe to walk. However, between capturing a first corner and a second corner of a wall, the walk icon 89 will indicate "do not walk" as shown in 6B.

FIG. 6B shows the reticle 24 with arms that are extended (e.g., by a user invoking the extend arm button 88). Also, FIG. 6B shows a dotted line 86 that could appear while the user captures the second corner of a wall. The dotted line 86 represents a line extending from the first corner of the wall to help facilitate the user in aligning the reticle 24 in capturing the second corner of the wall. FIG. 6B also shows plus and minus buttons 85, 87 for allowing a user to reconfigure the arms of the reticle 24. It should be well understood that the plus and minus touchscreen buttons 85, 87 are exemplary and that the reticle could be reconfigured in any manner (e.g., by dragging each arm of the reticle via the touch screen, using non-touchscreen buttons, etc.). Using the dotted line 86 for guidance, the user could use buttons 85 to adjust the left arm of the reticle 24 so that it matches the left arm of the second corner. Also, the user could use buttons 87 to adjust the right arm of the reticle 24 so that it matches the right arm of the second corner. Thus, the vertical guide 82, dotted line 86, and reconfigurable reticle 24 can allow a user to quickly capture corners of walls with a high degree of precision.

Figure 7:
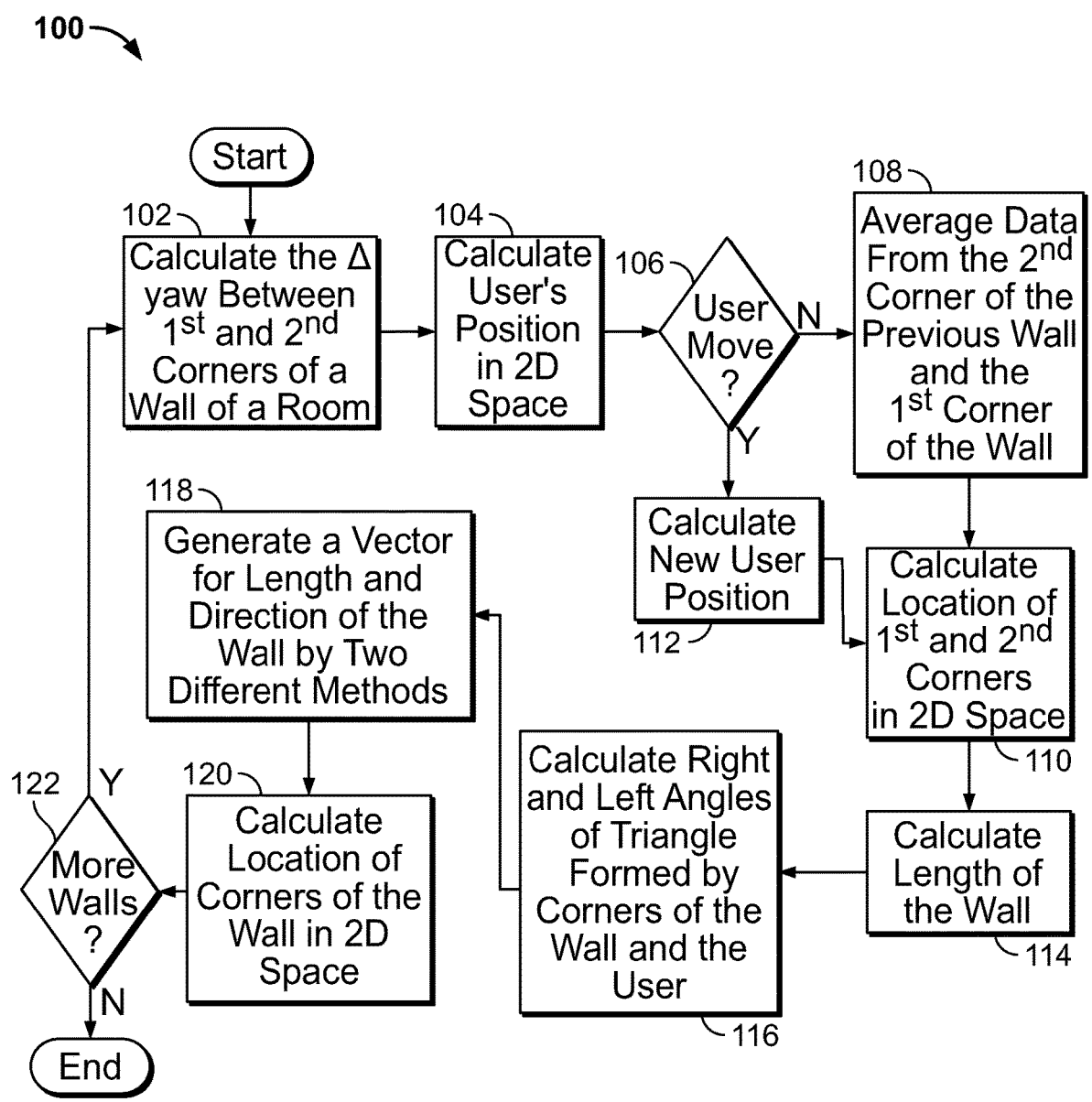
FIG. 7 is a flow chart showing processing steps performed by the interior modeling engine for processing walls.

FIG. 7 is a flow chart showing processing steps performed by the interior modeling engine 12 for processing walls. The wall processing step is performed in two phases. In the first phase, the wall processing module 46 derives for each wall: (a) the change in yaw angle (Δ-YAW) between the first corner of the wall and the second corner of the wall; (b) the user's position in relation to the wall; (c) whether or not the user has moved since capturing the previous wall; (d) the location in 2-D space of the wall's first and second corners;

(e) the wall's length; (f) the left and right angles at the corners; and (g) a unit vector indicating the direction of the wall. In step 102, for a wall of the interior space, the wall processing module 46 calculates the change in yaw between the first corner and the second corner. The wall processing module 46 also determines the direction the user utilized to capture the walls of the space (e.g., clockwise or counter-clockwise) by examining the two corners of the wall and comparing their yaw angles. From the change in yaw from the first corner to the second corner, the wall processing module 46 determines whether the walls were captured in a clockwise or counter-clockwise direction. If the walls were captured in a counter-clockwise direction, the list of captured walls is reordered to simulate a clockwise direction. In step 104, the wall processing module 46 calculates a user's position in two-dimensional space. The user's position is also initialized to zero in two-dimensional space (0, 0).

In step 106, the wall processing module 46 determines whether the user has moved since capturing the previous wall. For each corner captured, the yaw angle, pitch angle and distance to the corner at the moment of capture, are recorded for that corner. The distance is calculated, as discussed previously, from the calibrated height and the pitch angle. The change in yaw (Δ-YAW) between the previous corner and the current corner is recorded, along with the direction of change (e.g., clockwise or counter-clockwise) from the first corner to the second corner. A user orientation vector (e.g., unit vector) is created for the corner from the yaw angle. Utilizing the user orientation vector, the distance to the corner, and the user position, the wall processing module 46 determines where in two-dimensional space the corner lies in the Cartesian coordinates. From that point onward, the interior modeling engine processes walls by analyzing two corners at a time.

Thus, in determining whether the user has moved since capturing the previous wall, the wall processing module creates a vector from the user position to the first corner of the current wall. The wall processing module then reverses the direction of the vector (e.g., so that the vector points from the first corner of the current wall to the interior space). The wall processing module 46 then determines that the first corner of the current wall is the same corner as the second corner of the previous wall. Thus, the wall processing module 46 retrieves the stored data indicating the position of the second corner of the previous wall, and the position of the user when recording the previous wall. The wall processing module 46 then translates the stored data with the vector created for the current wall, to determine whether the user has changed position. For example, if the user did not move, then reversing the vector for the current wall should lead to the user's previous position. In such case, the wall processing module 46 has two readings from the same user position to the same corner location. Thus, in order to improve accuracy, in step 108, the wall processing module 46 averages the two distance readings. In step 110, the wall processing module uses the average of the two distances to calculate the position of first corner and second corner in two-dimensional space. If, however, the wall processing module 42 determines that reversing the vector for the current wall does not lead to the user's previous position, then it determines that the user did move to a new location. In such case, in step 112 the wall processing module 46 updates the user position. In step 110, the wall processing module 46 calculates the position of first corner and second corner in two-dimensional space. Also, moving forward, the wall processing module 46 will use the new user position as a starting point for calculating the positions of the corners. If and when the user moves again, the user position will be updated again.

In step 114, the wall processing module 46 calculates the length of the wall. In doing so, the wall processing module 46 retrieves the previously calculated first distance (e.g., from the user device to the first corner), second distance (e.g., from the user device to the second corner), and the intervening angle (e.g., the Δ-YAW). It then processes the data using the Law of Cosines to establish the length of the wall. Since the wall processing module 46 has determined the three sides of the triangle, in step 116, it then calculates the right and left angles using the Law of Cosines again.

In step 118, the wall processing module generates vectors for the length and direction of the wall by two different methods, a "physical" vector method and a "virtual" vector method, each of which are described in further detail below. In step 120, the wall processing module 46 calculates the location of the wall's corners in two-dimensional space. In step 122 the wall processing module 46 determines whether there are more walls in the room that require processing. If the determination is negative, then the process ends. If the wall processing module 46 determines that there are more walls to be processed, then it returns to step 102 to process the next wall.

Figure 8:
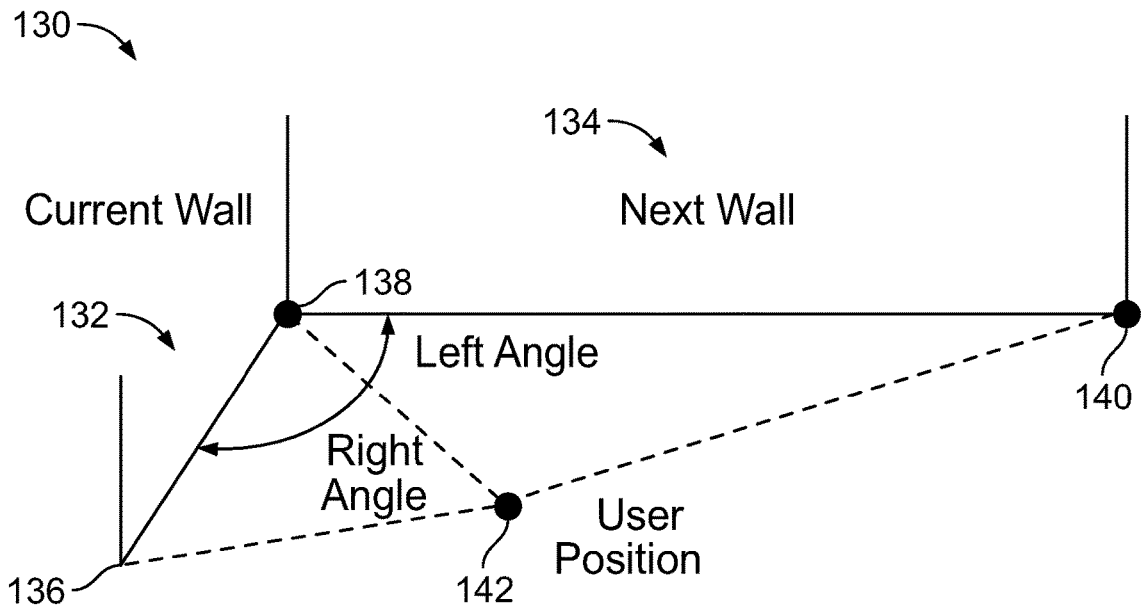
FIG. 8 is a diagram showing a user capturing corners of two different walls from the same position using the system.
Figure 9:
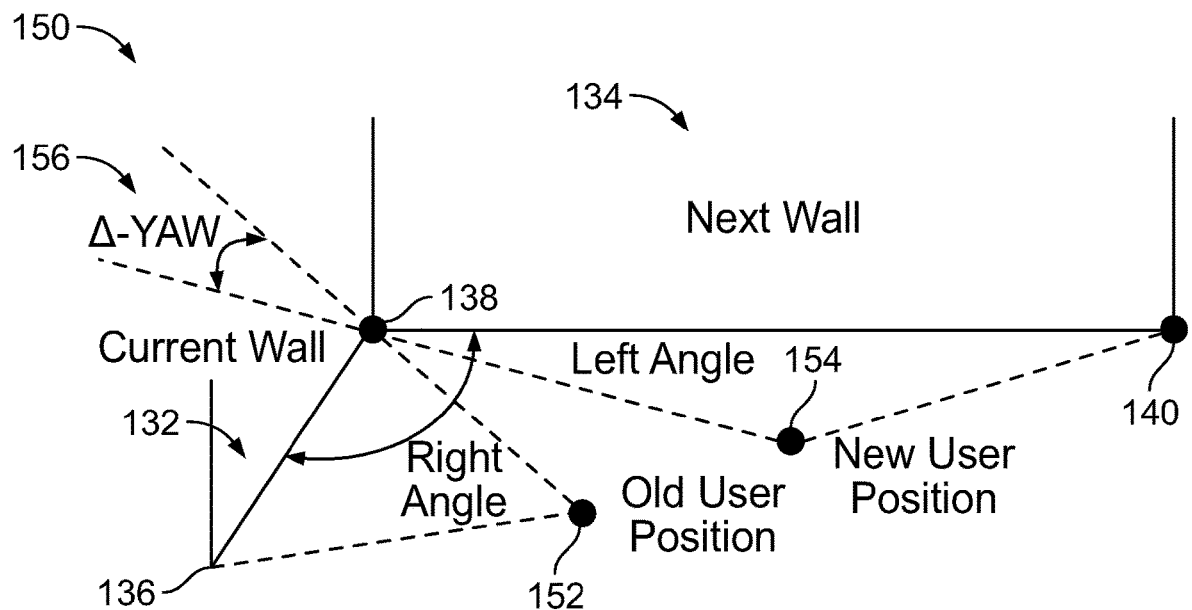
FIG. 9 is a diagram showing a user capturing corners of two different walls from different positions using the system.

Now turning to diagrams 130 and 150 shown in FIGS. 8 and 9, the wall processing unit 46 determines a "virtual angle" to the next wall 134 by examining the internal angles formed by the user position 142 and the corners 136, 138 of the wall 132, as discussed above. In step 116 of FIG. 7, the wall processing module 46 had calculated the right and left angles for each wall 132, 134. As shown in FIG. 8, if the user has not changed position 142 in between capturing the current wall 132 and the capturing the next wall 134, the virtual angle between the first wall and the next wall 134 can be calculated by adding the right angle of the current wall 132 to the left angle of the next wall 134. On the other hand, as shown in FIG. 9, if the user has changed from position 152 to 154 between capturing the current wall 132 and the capturing the next wall 154 (between the corners 138 and 140), the change in yaw 156 needs to be considered. As described below with reference to diagram 160 in FIG. 10, the virtual angle 166 (between corners 162 and 164) to the next wall 168 can be "snapped" to the closest angle divisible by 45 degrees. The virtual angle to the next wall is next compared to the "physical" angle to the next wall. If they are different, the corner between the current wall and the next wall is tagged as a "potential corner problem," which will be described in detail below. Any corners tagged as "potential corner problems" will be further analyzed later when the interior modeling engine corrects corner angle errors.

Figure 10:
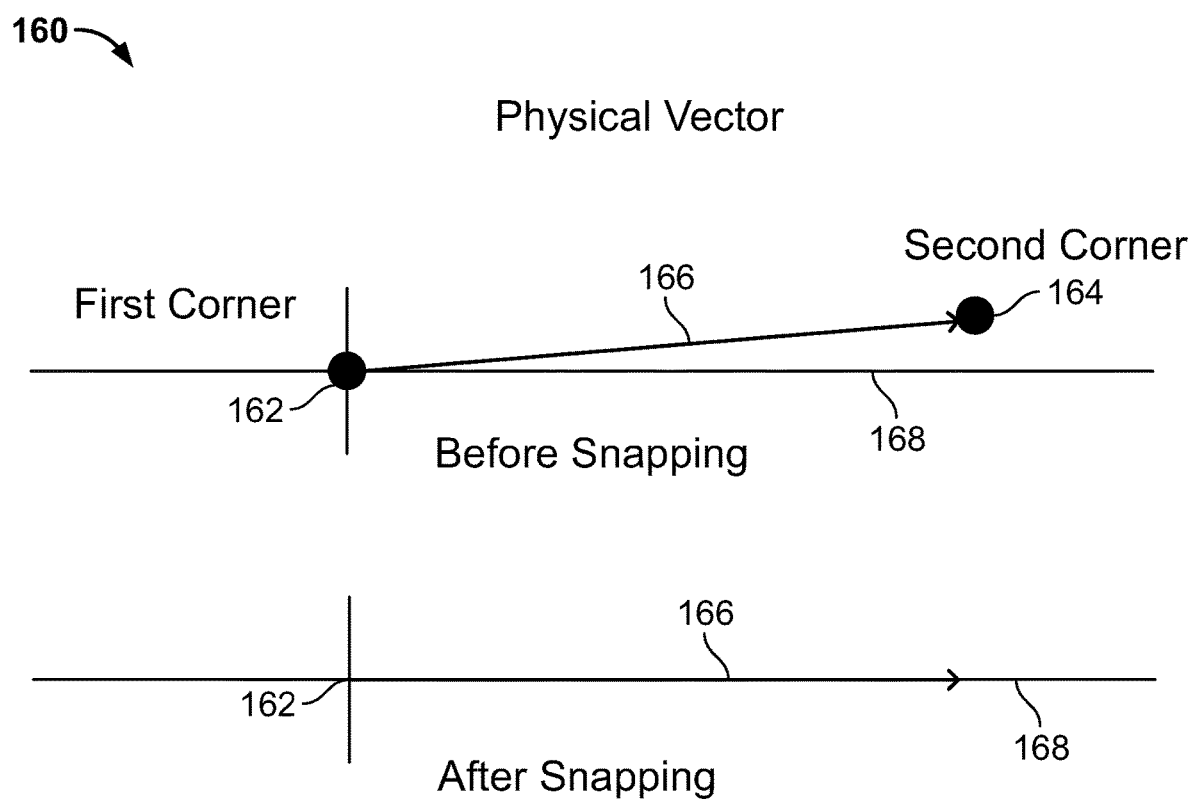
FIG. 10 is a diagram showing physical vector snapping performed by the system.

Now turning to FIG. 10, the application could carry out a "snapping" functionality to improve efficiency. FIG. 10 shows a "physical" vector from the first corner of the wall to the second corner of the wall. The application could limit the angle between two adjacent walls (e.g., to ±45°, ±90° or ±135°). In doing so, the application determines whatever angle is closest to an angle divisible by 45 degrees and "snaps" the angle to the next closes angle divisible by 45 degrees. For example, if the interior modeling engine calculates an angle as 41 degrees, then the wall processing module 46 will establish that the angle is 45 degrees, thereby "snapping" the physical vector into place, as seen in FIG. 10.

Figure 11:
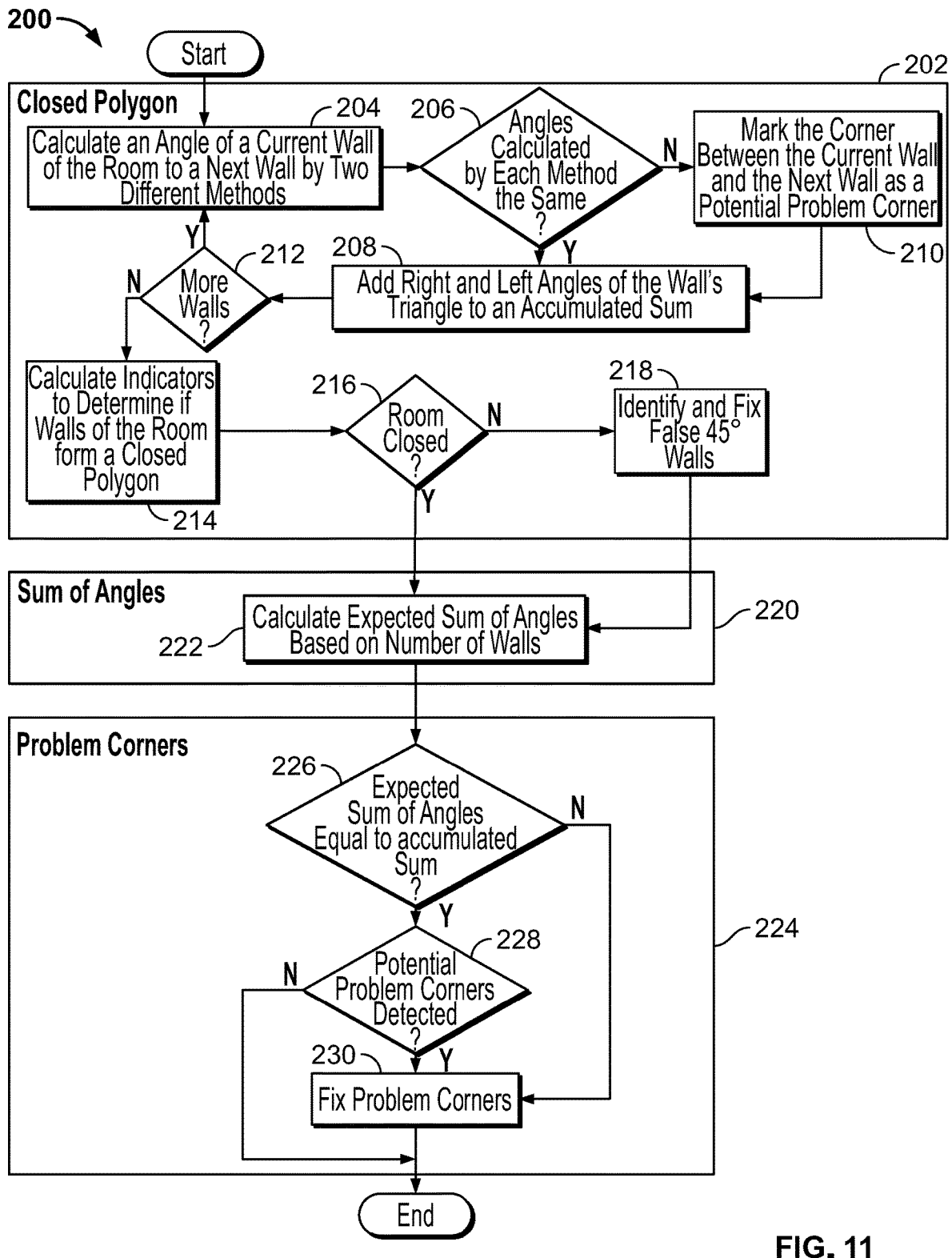
FIG. 11 is a flowchart showing processing steps carried out by the data correction module of the interior modeling engine.

FIG. 11 is a flowchart showing processing steps 200 carried out by the data correction module of the interior modeling engine 12. The data correction module 48 ensures that the final floor plan (e.g., a polygon generated by the system) is usable, meaningful, and correct. Error criteria used by the data correction module could include determining whether the polygon is closed, whether the polygon is self-intersecting, whether the angles at the corners of the polygon are correct and consistent, whether any corners have been flagged (e.g., potential problem corners), etc. Corner angles could be calculated incorrectly due to inaccurate input data, particularly for short wall segments where a slight misplacement of the guide and/or reticle when capturing corner data could result in significant errors, such as a 45° error in the calculated angle of the wall's vector (e.g., the "false 45° angle" problem). Comparatively, longer wall segments are less prone to this type of error because generally a slight misplacement of the reticle will have little effect on the wall's calculated vector.

The data correction module 48 first executes a closed polygon processing block 202. The closed polygon processing block 202 executes a closed polygon test which indicates whether or not the polygon representing the captured room is a closed polygon. If the polygon is not closed, this indicates that one or more of the "virtual" angles is incorrect.

Starting in step 204, the system calculates an angle of a current wall of the room to a next wall by two different methods. As explained below in more detail, one method includes rotating the "virtual" vector for the last wall by the amount specified by the last wall's "virtual" angle to the next wall. The resultant vector is then tested against the "virtual" vector for the first wall, which should match. If it doesn't match, the bad angles are found and fixed.

In step 206, a determination is made as to whether the angles calculated by each method are the same. If so, the system proceeds to step 210; if not, in step 208 the system marks the corner between the current wall and the next wall as a potential problem corner and then proceeds to step 210. In step 210 the system adds right and left angles of the wall's triangle to an accumulated sum. In step 212, the system determines whether there are more walls. If so, the system proceeds back to step 204; if not, the system proceeds to step 214 wherein the system calculates indicators to determine if walls of the room form a closed polygon. The system proceeds to step 216, wherein the system determines whether the walls and angles form a closed room. If so, the system proceeds to sum of angles processing block 220, and if not, in step 218 the system identifies and fixes false 45° walls and then proceeds to the sum of angles processing block 220.

The sum of the angles of a polygon with N sides is given by the following formula: Sum of angles=(N×180)−360. This expected sum of angles is compared to the sum of "virtual" angles of all of the corners, which should match. If it doesn't match, the bad angles are found and fixed. When executing the sum of angles processing block 220, in step 222, the system calculates an expected sum of angles based on the number of walls. Then, the system proceeds to the problem corners processing block 224. In step 226, a determination is made as to whether the expected sum of angles is equal to the accumulated sum of angles. If not, the system proceeds to step 230 and the system fixes the problem corners. Otherwise, the system proceeds to step 228 and a determination is made as to whether potential problem corners are detected. If so, the system proceeds to step 230, and any problem corners are investigated. Otherwise, processing ends.

Figure 12:
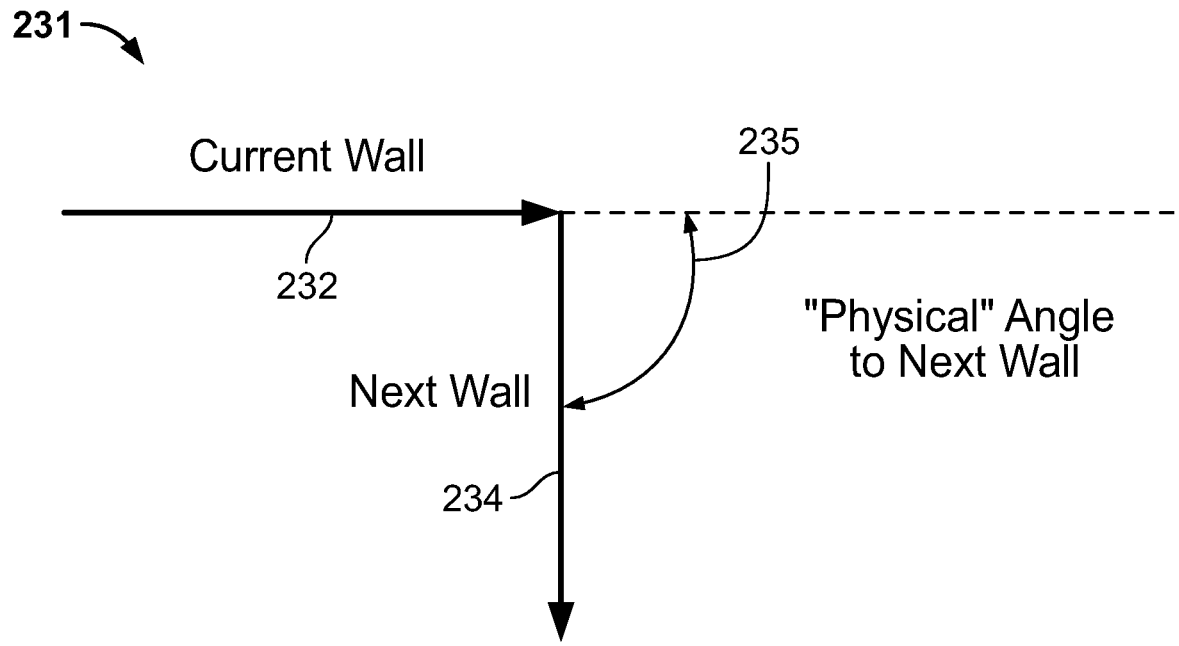
FIG. 12 is a diagram illustrating a physical angle between a vector of a current wall and the next wall.
Figure 13:
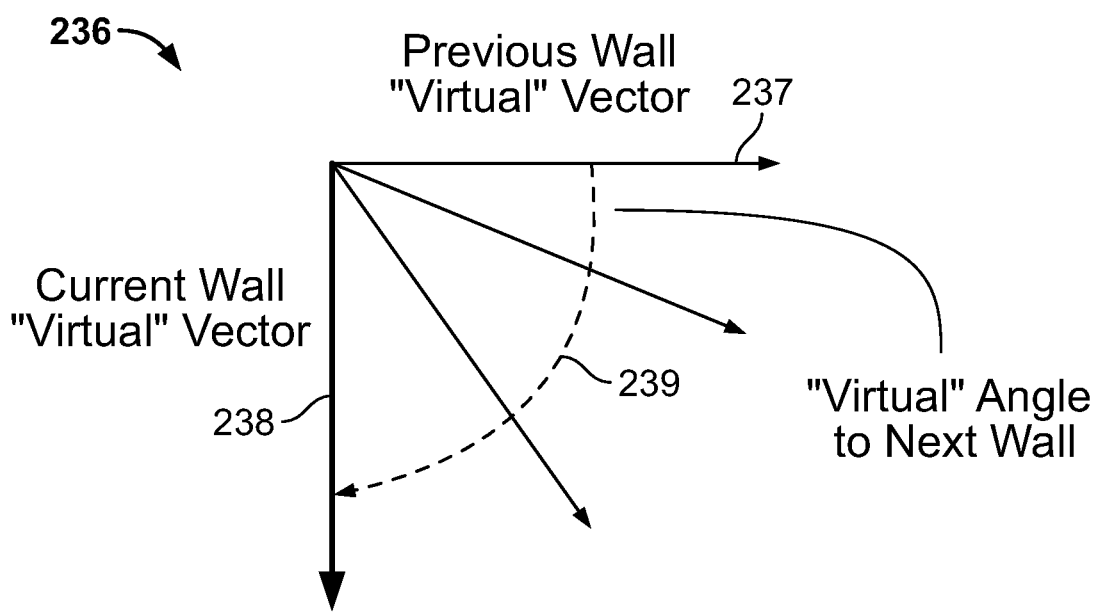
FIG. 13 is a diagram showing an angle of a previous wall virtual vector to a current wall virtual vector.

FIGS. 12-13 are diagrams showing two different methods for checking angle calculations using physical vectors and virtual vectors, as explained in FIG. 11 above. An algorithm (e.g., module) tracks a vector for each wall and an angle to a next wall using two different and separate methods. Doing so creates a cross check for the angle calculations. As explained above, the system marks corners as potential problems (e.g., problem corners) when the angles from the two methods do not agree.

FIG. 12 is a diagram 231 showing use by the system of physical vectors to check wall angles calculated by the system. The first method uses physical vectors, which are vectors for a wall established by connecting the first corner and second corner of the wall by a straight line. Each wall has its own individual physical vector. The physical vectors for a current wall 232 and a next wall 234 are used to generate a "physical" angle 235 to the next wall. This angle 235 is obtained by calculating the angular difference between the "physical" vector of the current wall 232 and the "physical" vector of the next wall 234.

FIG. 13 is a diagram 236 showing the use of virtual vectors to check wall angles calculated by the system. This second method uses virtual vectors, which are vectors for a wall established by taking a previous wall's "virtual" vector 237 and rotating it by the previous wall's "virtual" angle 239 to a next wall 238. The actual calculations for the "virtual" angle to a next wall is discussed in more detail above with reference to FIG. 9. The "virtual" vector for the first wall evaluated could be arbitrarily set to be a horizontal vector, such as a vector in the positive X direction on a Cartesian coordinate plane (e.g., the vector is (1,0)). The "virtual" angle could be compared to the "physical" angle, and, if different, the corner between the current wall and the next wall could be tagged as a "potential problem corner" to be investigated further when the system attempts to correct angle errors.

Figure 14:
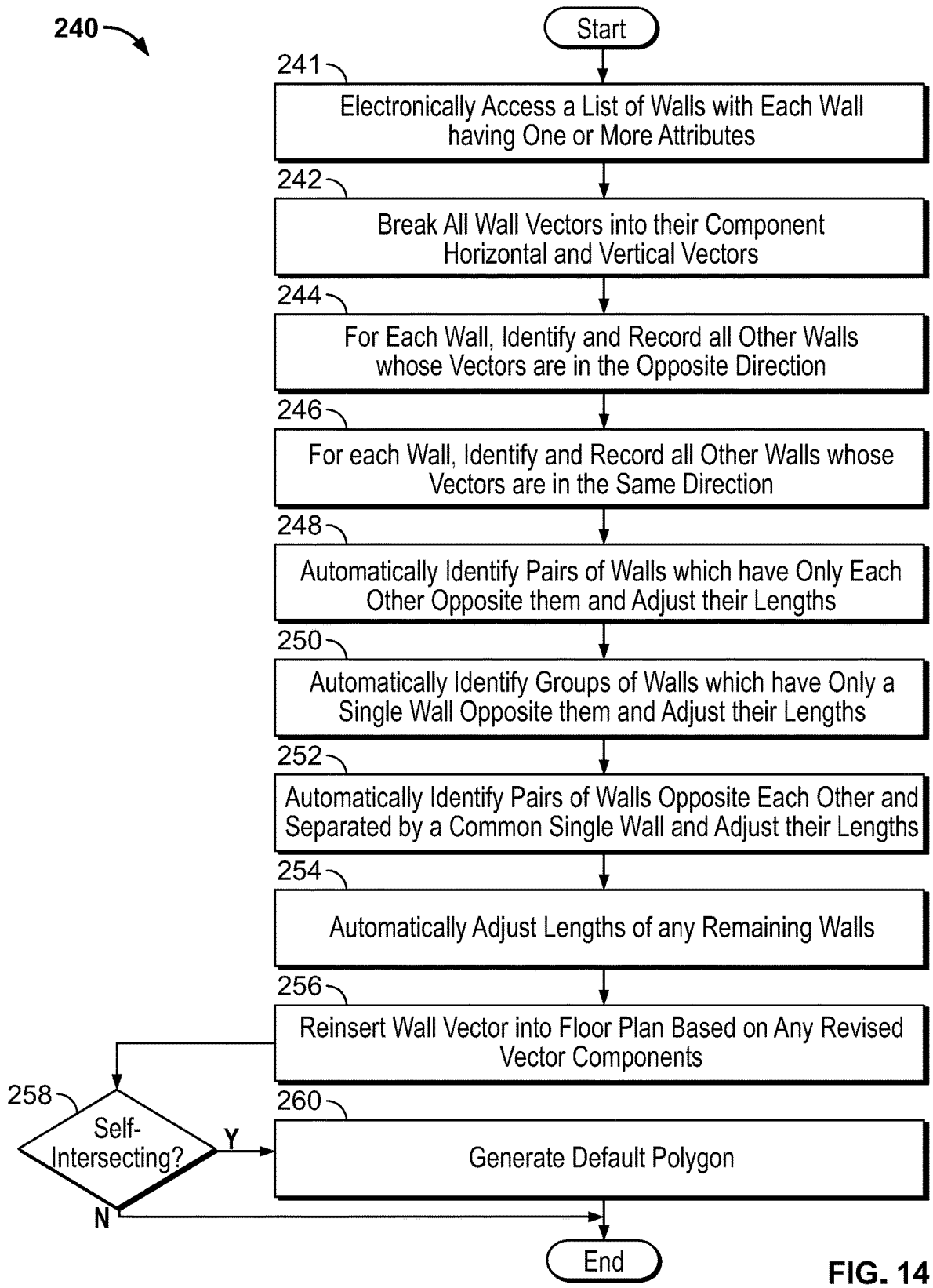
FIG. 14 is a flow chart showing processing steps carried out by the room squaring module of the interior module engine.

FIG. 14 is a flowchart showing processing steps 240 carried out by the room squaring module 50 of the interior modeling engine 12. The room squaring module 50 decomposes wall segments which are then analyzed and processed to ensure that the final result is a floor plan with squared off corners and walls.

In step 241, the module accesses (e.g., electronically receives) a list of walls, where each wall includes one or more attributes (e.g., a wall direction vector, a wall length, an angle of change from the current wall to the next wall, etc.). In step 242, the module breaks all wall vectors into their component horizontal and vertical components (e.g., X and Y component vectors). In step 244, the module identifies and records, for each wall, all other walls whose vectors are in the opposite direction (e.g., first list). In step 246, the module identifies and records, for each wall, all other walls whose vectors are in the same direction (e.g., second list). In this way, two lists could be created and associated with each wall. In step 248, the module automatically identifies pairs of walls which have only each other opposite them and adjust their lengths (e.g., lengths of the walls are adjusted to the average of the two wall lengths).

In step 250, the module automatically identifies groups of walls which have only a single wall opposite them and adjust their lengths (e.g., sum of the group's lengths is averaged with the single opposite wall's length and the adjustments are spread proportionally among the walls of the group). In step 252, the module automatically identifies pairs of walls opposite each other (having similar lengths) and separated by a common single wall (e.g., sharing a single wall between them) and adjusts their lengths (e.g., adjusted to be the average of the two wall lengths). In step 254, the module automatically adjust lengths of any remaining walls. More specifically, all the walls which are left unprocessed are grouped according to their direction and their sum is averaged with their opposite's sum and the adjustments are spread proportionally among the walls of the groups. For steps 248-254, as walls are processed they could be removed from the first and second lists created in steps 244 and 246.

In step 256, the module reinserts wall vectors into the floor plan based on any revised vector components (e.g., combines horizontal and vertical components into their respective wall vectors). In step 258, the module determines whether the polygon is self-intersecting (after all corrections have been made). If not, the process ends. If a positive determination is made, the system generates a default polygon in step 260. If the polygon is self-intersecting, there could still be problems with the angles, in which case the default polygon could be built using the original unsquared unprocessed corners.

Figure 15:
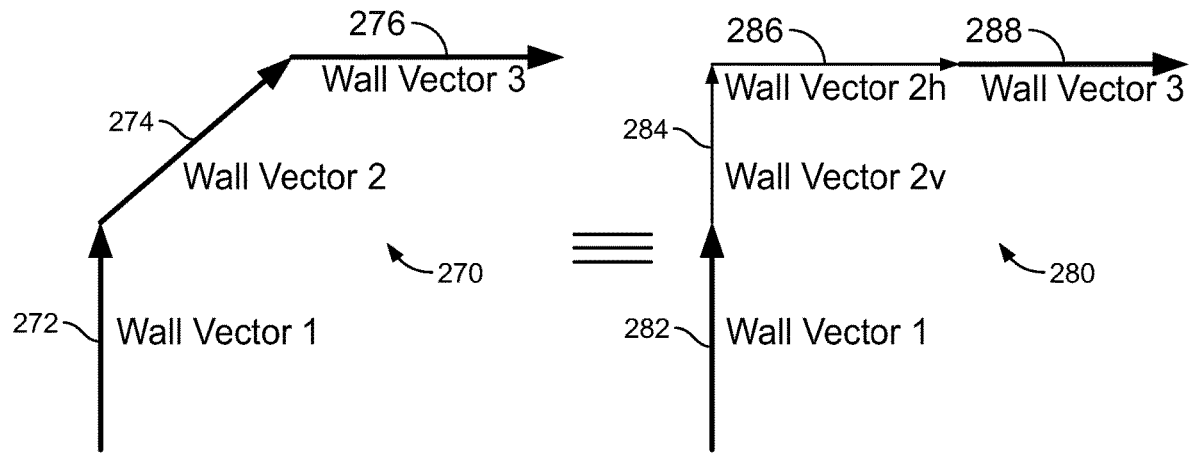
FIG. 15 is a diagram showing processing by the system of a wall vector into horizontal and vertical components.

FIG. 15 is a diagram showing decomposition of a wall vector into horizontal and vertical components as described in step 242 of FIG. 14. Section 270 shows a first wall vector 272, a second wall vector 274, and a third wall vector 276 of a portion of a room as measured by the system. In section 280 the room squaring module breaks up each of these wall vectors into their horizontal and vertical components. More specifically, the first wall vector 282 of section 280 has only a vertical component (no horizontal component) and remains the same as the first wall vector 272 of section 270. The second wall vector 274 of section 270 (a 45° angle vector) is broken up to a vertical wall vector component 284 and horizontal wall vector component 286 in section 280. The third wall vector 288 of section 280 has only a horizontal component (no vertical component) and remains the same as the third wall vector 276 of section 270. This room squaring functionality improves the floor plans corners.

Figure 16:
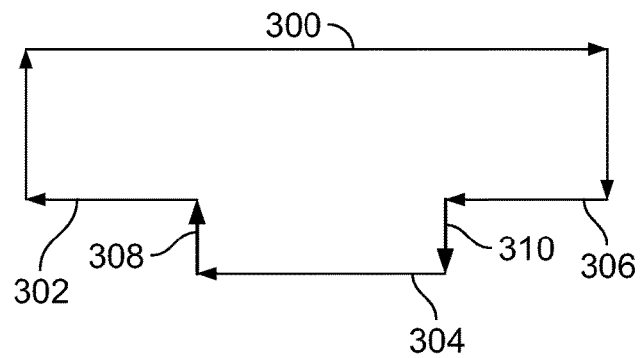
FIGS. 16-17 are figures showing room "squaring" steps performed by the room squaring module.
Figure 17:
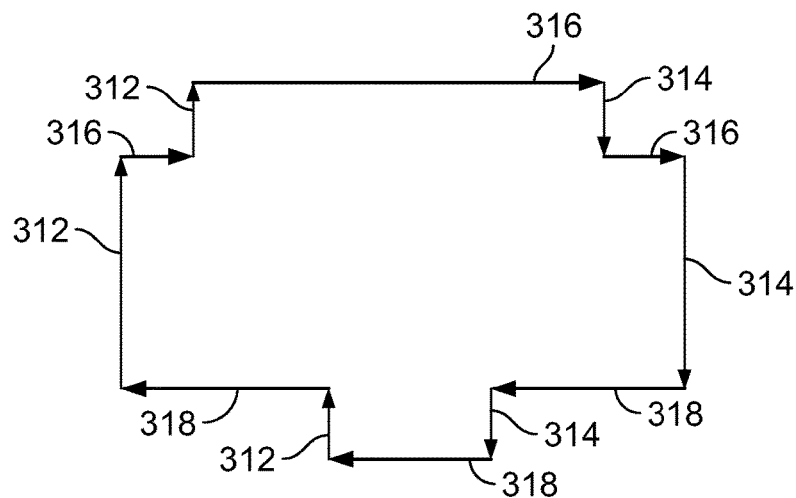

FIGS. 16-17 are diagrams showing room "squaring" steps performed by the room squaring module of FIG. 14. In FIG. 16, and as described in step 250 of FIG. 14, the room squaring module 50 automatically identifies groups of walls 302, 304, and 306 which have only a single wall 300 opposite them and adjust their lengths. Then, as described in step 252 of FIG. 14, the room squaring 50 module automatically identifies pairs of walls opposite each other with similar lengths 308 and 310 and separated by a common single wall 304 and adjusts their lengths. As shown in FIG. 17 and as described in step 254 of FIG. 14, all the walls which are unprocessed are grouped according to their direction, such that a first group could include walls 312, a second group of walls 314, a third group of walls 316, and a fourth group of walls 318. The sum of a group of walls of a first direction are averaged with the sum of a group of walls of a second direction opposite to the first direction. For example, the sum of the walls 312 (group 1) are averaged with the sum of the walls 314 (group 2), and the sum of walls 316 (group 3) are averaged with the sum of the walls 318 (group 4). Adjustments are then spread proportionally among the walls of the groups.

Figure 18:
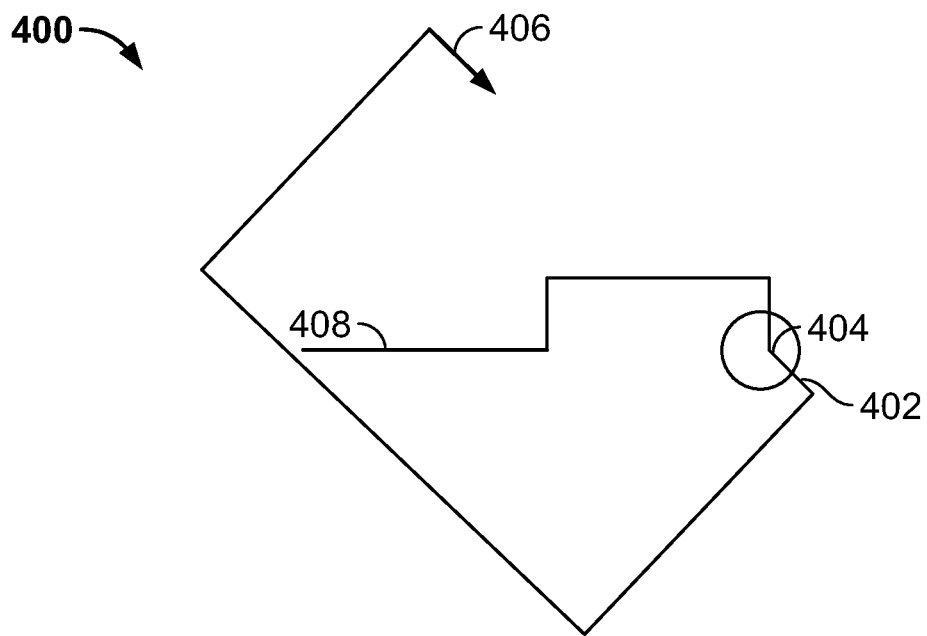
FIGS. 18-19 are diagrams showing detection and rectification of inaccuracies in the floor plan performed by the system.
Figure 19:
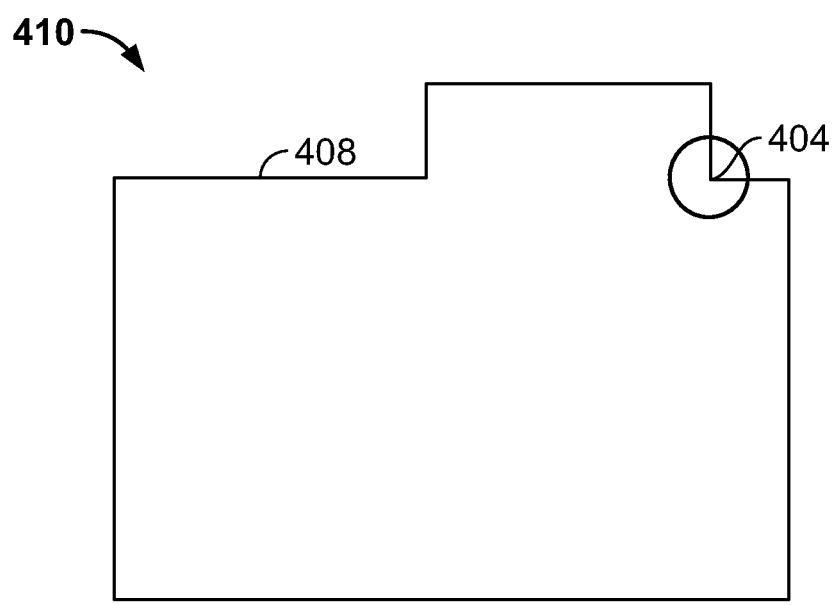

FIGS. 18-19 are diagrams showing the detection and rectification of inaccuracies performed by the system. FIG. 18 shows a floor plan 400 with an inaccuracy resulting from improper capturing of corner data for the wall segment 402 beginning with corner 404 (but with all other data captured correctly). This situation could be detected using one or more of the tests described in more detail above with respect to the data correction module (e.g., sum of angles test, closed polygon test, etc.). For example, using the closed polygon test, the expected vector 406 of the first wall (as calculated from the vector of the last wall rotated by the angle to next wall) is compared to the actual vector 408 of the first wall, and found not to match.

As shown in FIG. 19, the floor plan (or polygon) 410 is corrected by adjusting corner 404 such that actual vector 408 of the first wall matches the expected vector 406 of the first wall. This problem could be corrected by scanning through the wall segments, detecting the problem angle (e.g., problem corner) and correcting the angle. The system could also check the corners which have been flagged as "potential problem" corners and make corrections where necessary (as described above in more detail).

Figure 20:
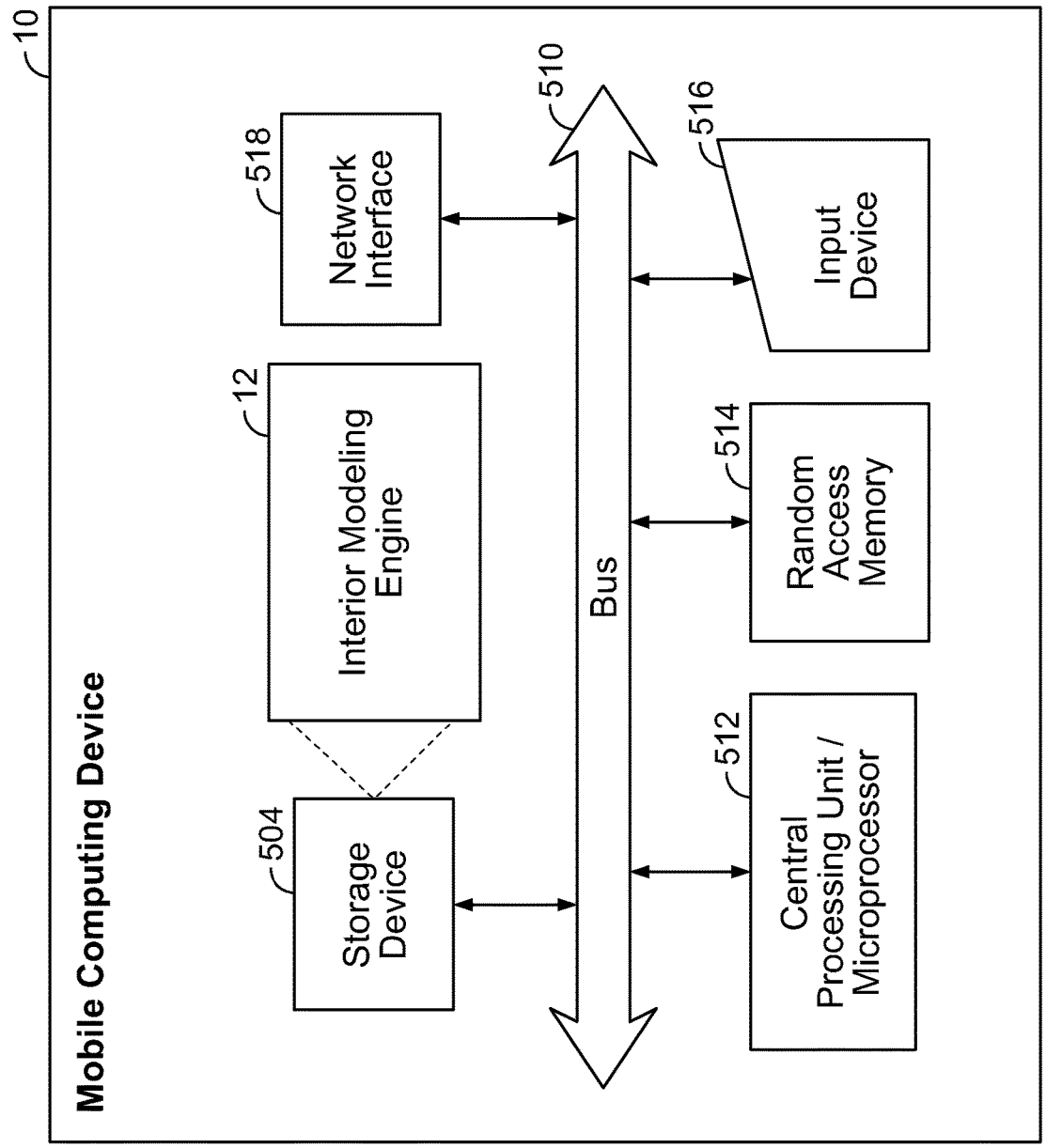
FIG. 20 is a diagram showing hardware and software components of the mobile computing device.

FIG. 20 is a diagram showing hardware and software components of the mobile computing device 10. The device 10 could include a storage device 504, a network interface 508, a communications bus 510, a central processing unit (CPU) (microprocessor) 512, a random access memory (RAM) 514, and one or more input devices 516, such as a keyboard, mouse, etc. The server 502 could also include a display (e.g., liquid crystal display (LCD), cathode ray tube (CRT), etc.). The storage device 504 could comprise any suitable, computer-readable storage medium such as disk, non-volatile memory (e.g., read-only memory (ROM), eraseable programmable ROM (EPROM), electrically-eraseable programmable ROM (EEPROM), flash memory, field-programmable gate array (FPGA), etc.). The device 10 could be a networked computer system, a personal computer, a smart phone, tablet computer etc. It is noted that the device 10 need not be networked, and indeed, could be a stand-alone computer system.

The interior modeling engine 12 could be embodied as computer-readable program code stored on the storage device 504 and executed by the CPU 512 using any suitable, high or low level computing language, such as Python, Java, C, C++, C#, .NET, MATLAB, etc. The network interface 508 could include an Ethernet network interface device, a wireless network interface device, or any other suitable device which permits the server 502 to communicate via the network. The CPU 512 could include any suitable single- or multiple-core microprocessor of any suitable architecture that is capable of implementing and running the interior modeling engine 506 (e.g., Intel processor). The random access memory 514 could include any suitable, high-speed, random access memory typical of most modern computers, such as dynamic RAM (DRAM), etc.

Having thus described the system and method in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure. What is desired to be protected by Letters Patent is set forth in the following claims.

What is claimed is:

1. A system for generating a computerized floor plan of a space within a building, comprising:
   a mobile computing device including a camera, a display, and means for determining a physical orientation of the mobile computing device; and
   an interior modeling engine stored in memory of the mobile computing device and executed by the mobile computing device, the interior modeling engine causing the camera to capture images of the space within the building and causing the display to display images of the space,
   wherein the interior modeling engine prompts a user of the mobile computing device to point the mobile computing device to a first corner of the space formed by two adjacent walls within the room, align a reticle displayed on the display of the mobile computing device with the first corner, and capture the first corner by actuating a button displayed on the display, wherein the interior modeling engine prompts the user to capture additional corners of the room using the reticle and the button displayed on the display, wherein the interior modeling engine allows the user to move from a first position within the room to a second position within the room while generating the computerized floor plan, and wherein the interior modeling engine obtains orientation information of the mobile computing device from the means for determining the physical orientation of the mobile computing device when each corner is captured and processes the captured corners and the orientation information to calculate a computerized floor plan of the space, the display displaying the floor plan as the floor plan is being created by the interior modeling engine, wherein the interior modeling engine further comprises a data correction module that corrects angles and walls identified by the interior modeling engine, and wherein the data correction module corrects angle errors by creating a resultant vector using a virtual vector of a previous wall identified by the interior modeling engine and a virtual angle of a next wall, testing the virtual vector with the resultant vector for a match, and correcting angles associated with the virtual vector when the virtual vector and the resultant vector do not match, until the virtual vector and the resultant vector match.

2. The system of claim 1, wherein the modeling engine includes a calibration engine for calibrating the interior modeling engine.

3. The system of claim 2, wherein the calibration engine receives information indicating a length of a wall in the space and an indication that the reticle is pointed to the first corner in the space, and captures an angle formed by the arms of the reticle.

4. The system of claim 3, wherein the calibration engine captures yaw and pitch information corresponding to the first corner.

5. The system of claim 4, wherein the calibration engine receives an indication that the reticle is pointed to a second corner in the space, and captures an angle formed by arms of the reticle and yaw and pitch information corresponding to the second corner.

6. The system of claim 5, wherein the calibration module calculates distances formed from the user's position to the first and second corners using the length of the wall, the captured angles, and yaw and pitch information for the first and second corners.

7. The system of claim 1, wherein the interior modeling engine includes a wall capturing module for capturing a plurality of walls of the space.

8. The system of claim 7, wherein the wall capture module allows the user to adjust arms of the reticle to match an angle of a corner pointed to by the reticle.

9. The system of claim 7, wherein the wall capture module captures angles formed by two corners of a wall and calculates a length of a wall segment between the two corners.

10. The system of claim 7, wherein the wall capturing engine generates a line interconnecting the reticle with a corner previously captured by the interior modeling engine, and displays the line on the display.

11. The system of claim 1, wherein the wall capturing engine comprises a wall processing module.

12. The system of claim 11, wherein the wall processing module calculates changes in yaw angles between a first corner of a wall and a second corner of the wall.

13. The system of claim 11, wherein the wall processing module calculates a user's position in relation to the wall.

14. The system of claim 11, wherein the wall processing module determines whether a user has moved since capturing of a previous wall.

15. The system of claim 11, wherein the wall processing module calculates locations in a two-dimensional space of first and second corners of a wall.

16. The system of claim 11, wherein the wall processing module calculates a length of a wall.

17. The system of claim 11, wherein the wall processing module calculates left and right angles formed at corners of a wall.

18. The system of claim 11, wherein the wall processing module calculates a unit vector indicating a direction of a wall.

19. The system of claim 1, wherein the wall processing module determines a virtual angle to an adjacent wall by examining internal angles formed by a user's position and corners of a current wall.

20. The system of claim 1, wherein the interior modeling engine snaps a physical vector corresponding to a wall identified by the interior modeling engine to a pre-defined angle.

21. The system of claim 1, wherein the data correction module performs closed polygon processing of the computerized floor plan.

22. The system of claim 1, wherein the data correction module performs sum of angles processing of the computerized floor plan.

23. The system of claim 1, wherein the interior modeling engine further comprises a room squaring module.

24. The system of claim 23, wherein the room squaring module processes wall segments and adjusts corners of the floor plan so that the floor plan includes corners and walls that are squared off.

25. The system of claim 1, wherein the interior modeling engine displays an overhead view of the computerized floor plan on the display.

26. The system of claim 1, wherein the interior modeling engine transmits the computerized floor plan to a remote computer system.

27. A method for generating a computerized floor plan of a space within a building, comprising the steps of:

capturing images of a space within a building using a camera of a mobile computing device;

displaying images of the space on a display of the mobile computing device;

prompting a user of the mobile computing device to point the mobile computing device to a first corner of the space formed by two adjacent walls within the room;

allowing the user to align a reticle displayed on the display of the mobile computing device with the first corner;

capturing the first corner by actuating a button displayed on the display;

capturing additional corners of the room using the reticle and the button displayed on the display;

obtaining orientation information of the mobile computing device when each corner is captured;

processing the captured corners and the orientation information using an interior modeling engine executed by the mobile computing device to calculate a computerized floor plan of the space, wherein the interior modeling engine allows the user to move from a first position within the room to a second position within the room while generating the computerized floor plan;

displaying the floor plan as the floor plan is being created by the interior modeling engine;

correcting angles and walls identified by the interior modeling engine;

creating a resultant vector using a virtual vector of a previous wall identified by the interior modeling engine and a virtual angle of a next wall;

testing the virtual vector with the resultant vector for a match; and correcting angles associated with the virtual vector when the virtual vector and the resultant vector do not match, until the virtual vector and the resultant vector match.

28. The method of claim 27, further comprising receiving information indicating a length of a wall in the space and an indication that the reticle is pointed to the first corner in the space, and capturing an angle formed by the arms of the reticle.

29. The method of claim 28, further comprising capturing yaw and pitch information corresponding to the first corner.

30. The method of claim 29, further comprising receiving an indication that the reticle is pointed to a second corner in the space, and capturing an angle formed by arms of the reticle and yaw and pitch information corresponding to the second corner.

31. The method of claim 30, further comprising calculating distances formed from the user's position to the first and second corners using the length of the wall, the captured angles, and yaw and pitch information for the first and second corners.

32. The method of claim 27, further comprising allowing the user to adjust arms of the reticle to match an angle of a corner pointed to by the reticle.

33. The method of claim 32, further comprising capturing angles formed by two corners of a wall and calculating a length of a wall segment between the two corners.

34. The method of claim 33, further comprising generating a line interconnecting the reticle with a corner previously captured, and displaying the line on the display.

35. The method of claim 27, further comprising calculating changes in yaw angles between a first corner of a wall and a second corner of the wall.

36. The method of claim 35, further comprising calculating a user's position in relation to the wall.

37. The method of claim 27, further comprising determining whether a user has moved since capturing of a previous wall.

38. The method of claim 27, further comprising calculating locations in a two-dimensional space of first and second corners of a wall.

39. The method of claim 27, further comprising calculating a length of a wall.

40. The method of claim 27, further comprising calculating left and right angles formed at corners of a wall.

41. The method of claim 27, further comprising calculating a unit vector indicating a direction of a wall.

42. The method of claim 27, further comprising determining a virtual angle to an adjacent wall by examining internal angles formed by a user's position and corners of a current wall.

43. The method of claim 27, further comprising snapping a physical vector corresponding to a wall identified by the interior modeling engine to a pre-defined angle.

44. The method of claim 27, further comprising performing closed polygon processing of the computerized floor plan.

45. The method of claim 44, further comprising performing sum of angles processing of the computerized floor plan.

46. The method of claim 27, further comprising processing wall segments and adjusts corners of the floor plan so that the floor plan includes corners and walls that are squared off.

47. The method of claim 27, further comprising displaying an overhead view of the computerized floor plan on the display.

48. The method of claim 27, further comprising transmitting the computerized floor plan to a remote computer system.

49. A non-transitory, computer-readable medium having computer-readable instructions stored thereon which, when executed, cause a mobile computing device to generate a computerized floor plan of a space within a building by performing steps comprising:

capturing images of a space within a building using a camera of the mobile computing device;

displaying images of the space on a display of the mobile computing device;

prompting a user of the mobile computing device to point the mobile computing device to a first corner of the space formed by two adjacent walls within the room;

allowing the user to align a reticle displayed on the display of the mobile computing device with the first corner;

capturing the first corner by actuating a button displayed on the display;

capturing additional corners of the room using the reticle and the button displayed on the display;

obtaining orientation information of the mobile computing device when each corner is captured;

processing the captured corners and the orientation information using an interior modeling engine executed by the mobile computing device to calculate a computerized floor plan of the space, wherein the interior modeling engine allows the user to move from a first position within the room to a second position within the room while generating the computerized floor plan;

displaying the floor plan as the floor plan is being created by the interior modeling engine;

correcting angles and walls identified by the interior modeling engine;

creating a resultant vector using a virtual vector of a previous wall identified by the interior modeling engine and a virtual angle of a next wall;

testing the virtual vector with the resultant vector for a match; and correcting angles associated with the virtual vector when the virtual vector and the resultant vector do not match, until the virtual vector and the resultant vector match.

50. The non-transitory computer-readable medium of claim 49, further comprising receiving information indicating a length of a wall in the space and an indication that the reticle is pointed to the first corner in the space, and capturing an angle formed by the arms of the reticle.

51. The non-transitory computer-readable medium of claim 50, further comprising capturing yaw and pitch information corresponding to the first corner.

52. The non-transitory computer-readable medium of claim 50, further comprising receiving an indication that the reticle is pointed to a second corner in the space, and capturing an angle formed by arms of the reticle and yaw and pitch information corresponding to the second corner.

53. The non-transitory computer-readable medium of claim 52, further comprising calculating distances formed from the user's position to the first and second corners using the length of the wall, the captured angles, and yaw and pitch information for the first and second corners.

54. The non-transitory computer-readable medium of claim 49, further comprising allowing the user to adjust arms of the reticle to match an angle of a corner pointed to by the reticle.

55. The non-transitory computer-readable medium of claim 54, further comprising capturing angles formed by two corners of a wall and calculating a length of a wall segment between the two corners.

56. The non-transitory computer-readable medium of claim 55, further comprising generating a line interconnecting the reticle with a corner previously captured, and displaying the line on the display.

57. The non-transitory computer-readable medium of claim 49, further comprising calculating changes in yaw angles between a first corner of a wall and a second corner of the wall.

58. The non-transitory computer-readable medium of claim 57, further comprising calculating a user's position in relation to the wall.

59. The non-transitory computer-readable medium of claim 49, further comprising determining whether a user has moved since capturing of a previous wall.

60. The non-transitory computer-readable medium of claim 49, further comprising calculating locations in a two-dimensional space of first and second corners of a wall.

61. The non-transitory computer-readable medium of claim 49, further comprising calculating a length of a wall.

62. The non-transitory computer-readable medium of claim 49, further comprising calculating left and right angles formed at corners of a wall.

63. The non-transitory computer-readable medium of claim 49, further comprising calculating a unit vector indicating a direction of a wall.

64. The non-transitory computer-readable medium of claim 49, further comprising determining a virtual angle to an adjacent wall by examining internal angles formed by a user's position and corners of a current wall.

65. The non-transitory computer-readable medium of claim 49, further comprising snapping a physical vector corresponding to a wall identified by the interior modeling engine to a pre-defined angle.

66. The non-transitory computer-readable medium of claim 49, further comprising performing closed polygon processing of the computerized floor plan.

67. The non-transitory computer-readable medium of claim 66, further comprising performing sum of angles processing of the computerized floor plan.

68. The non-transitory computer-readable medium of claim 49, further comprising processing wall segments and adjusts corners of the floor plan so that the floor plan includes corners and walls that are squared off.

69. The non-transitory computer-readable medium of claim 49, further comprising displaying an overhead view of the computerized floor plan on the display.

70. The non-transitory computer-readable medium of claim 49, further comprising transmitting the computerized floor plan to a remote computer system.

\* \* \* \* \*